(12) United States Patent
Xie et al.

(10) Patent No.: US 12,501,698 B2
(45) Date of Patent: Dec. 16, 2025

(54) STACKED TRANSISTORS HAVING SELF ALIGNED BACKSIDE CONTACT WITH BACKSIDE REPLACEMENT METAL GATE

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Chanro Park, Clifton Park, NY (US); Min Gyu Sung, Latham, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 18/145,034

(22) Filed: Dec. 22, 2022

(65) Prior Publication Data

US 2024/0213248 A1    Jun. 27, 2024

(51) Int. Cl.
| | | |
|---|---|---|
| *H10D 84/85* | (2025.01) | |
| *H01L 23/535* | (2006.01) | |
| *H10D 30/01* | (2025.01) | |
| *H10D 30/43* | (2025.01) | |
| *H10D 30/67* | (2025.01) | |
| *H10D 62/10* | (2025.01) | |
| *H10D 64/01* | (2025.01) | |
| *H10D 84/01* | (2025.01) | |

(Continued)

(52) U.S. Cl.
CPC ......... *H10D 84/856* (2025.01); *H01L 23/535* (2013.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/0186* (2025.01); *H10D 84/0193* (2025.01); *H10D 84/038* (2025.01); *H10D 84/853* (2025.01); *H10D 88/01* (2025.01)

(58) Field of Classification Search
CPC .......... H10D 30/6757; H10D 84/0149; H10D 84/83; H10D 88/00
See application file for complete search history.

(56) References Cited

U.S. PATENT DOCUMENTS

| | | |
|---|---|---|
| 9,515,164 B2 | 12/2016 | Ando |
| 9,515,185 B2 | 12/2016 | Liu |
| 10,192,819 B1 | 1/2019 | Chanemougame |
| (Continued) | | |

OTHER PUBLICATIONS

Ryckaert et al., "Extending the roadmap beyond 3nm through system scaling boosters: A case study on Buried Power Rail and Backside Power Delivery", 2019 Electron Devices Technology and Manufacturing Conference (EDTM), 2019 IEEE, pp. 50-52.

(Continued)

*Primary Examiner* — Fernando L Toledo
*Assistant Examiner* — Adam S Bowen
(74) *Attorney, Agent, or Firm* — L. Jeffrey Kelly

(57) ABSTRACT

A semiconductor structure including stacked transistor structures each including a top device stacked directly above a bottom device, and a placeholder dielectric and a backside gate contact within a dielectric capping layer beneath the stacked transistor structures, where the placeholder dielectric is directly below a first bottom source drain region, and the backside gate contact is directly below a second bottom source drain region.

21 Claims, 29 Drawing Sheets

(51) Int. Cl.
*H10D 84/03* (2025.01)
*H10D 88/00* (2025.01)

(56) References Cited

U.S. PATENT DOCUMENTS

| | | |
|---|---|---|
| 10,192,867 B1 | 1/2019 | Frougier |
| 10,510,622 B1 | 12/2019 | Frougier |
| 10,985,103 B2 | 4/2021 | Hong |
| 2020/0266169 A1 | 8/2020 | Kang |
| 2022/0181197 A1 | 6/2022 | Tao |
| 2022/0352074 A1* | 11/2022 | Chen .................... H01L 23/535 |
| 2023/0062940 A1* | 3/2023 | Khaderbad .......... H10D 30/014 |

OTHER PUBLICATIONS

Ryckaert et al., "The Complementary FET (CFET) for CMOS scaling beyond N3", 2018 Symposium on VLSI Technology Digest of Technical Papers, 2018 IEEE, pp. 141-142.

* cited by examiner

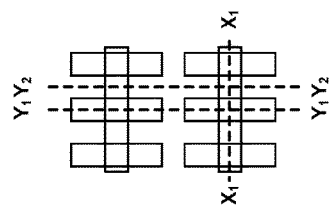
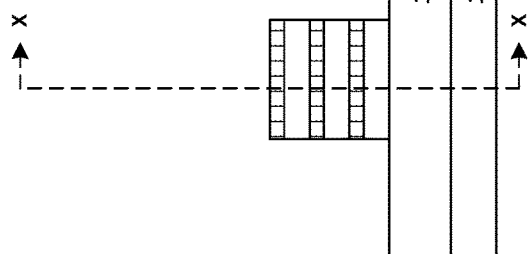
FIG. 3
SECTION $Y_2$-$Y_2$
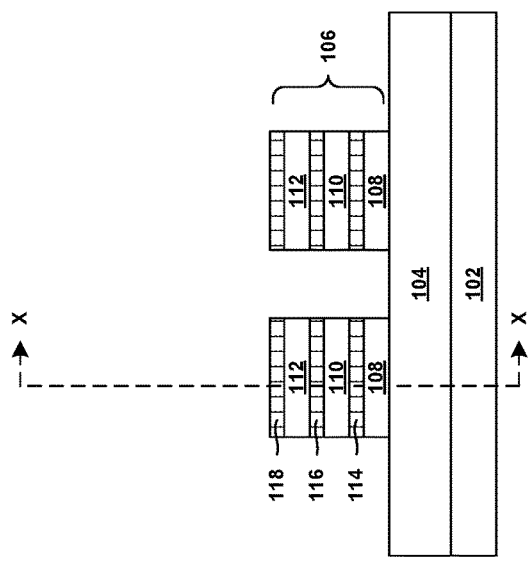
FIG. 2
SECTION $Y_1$-$Y_1$
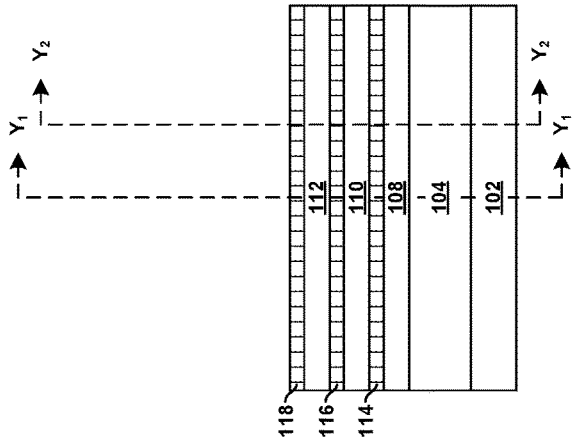
FIG. 1
SECTION X-X

SECTION $Y_2$-$Y_2$

SECTION $Y_1$-$Y_1$

SECTION X-X

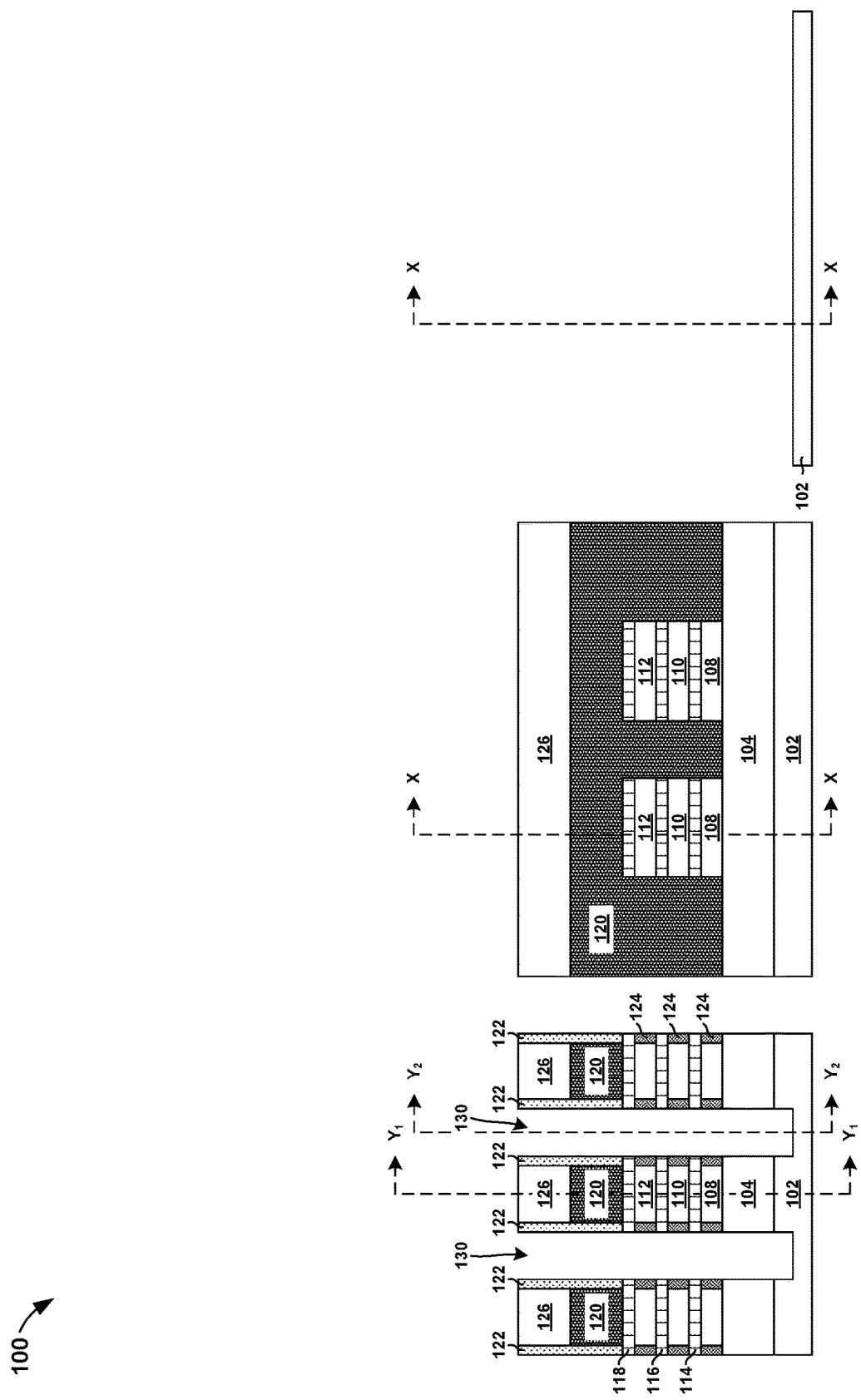

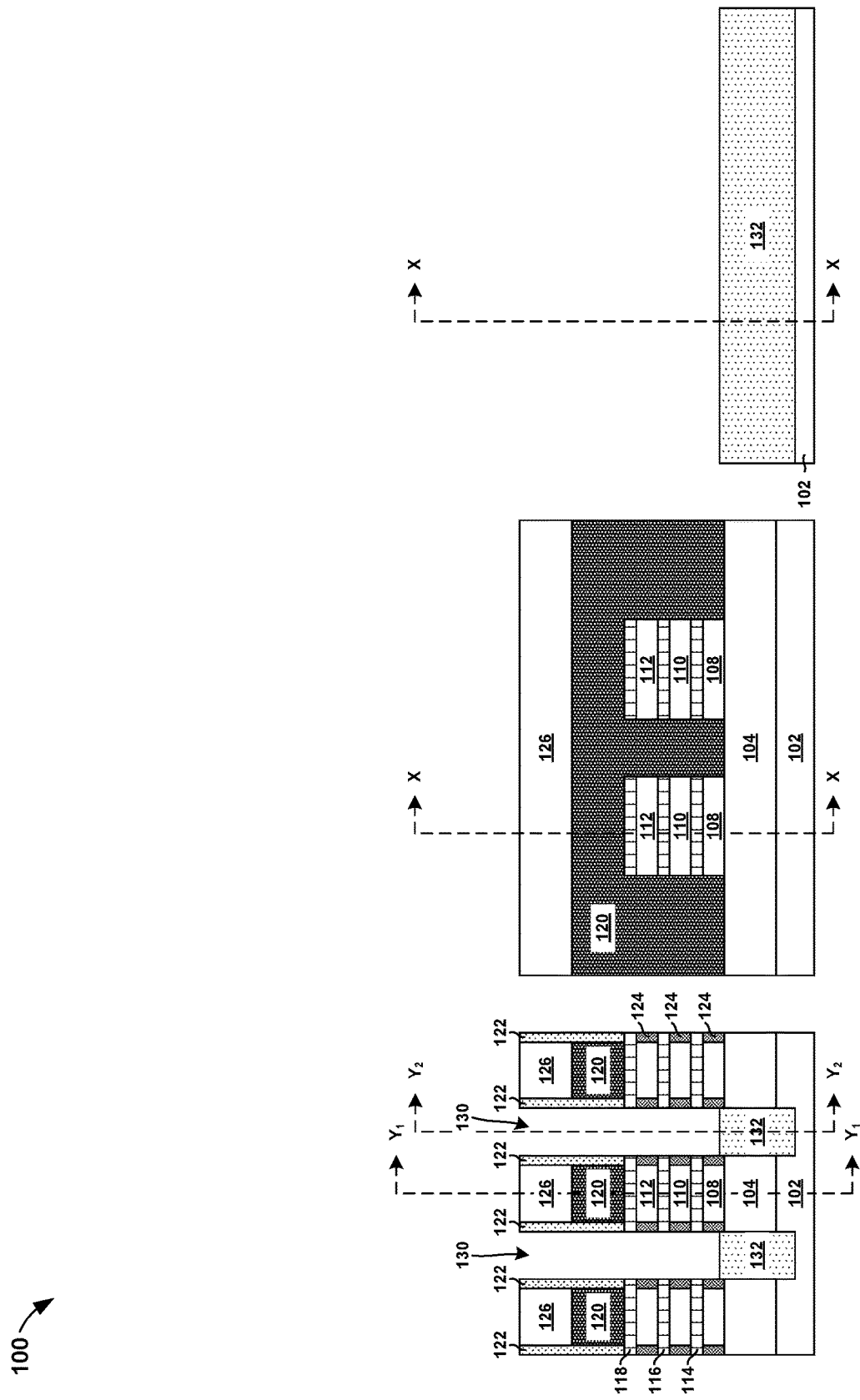

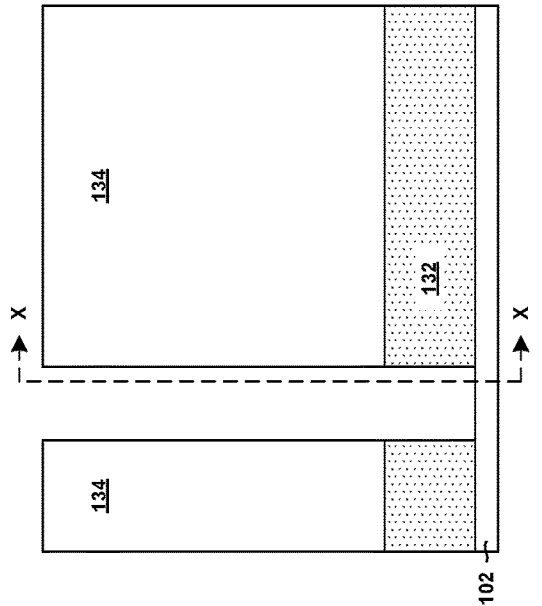
FIG. 15
SECTION Y₂-Y₂
FIG. 14
SECTION Y₁-Y₁
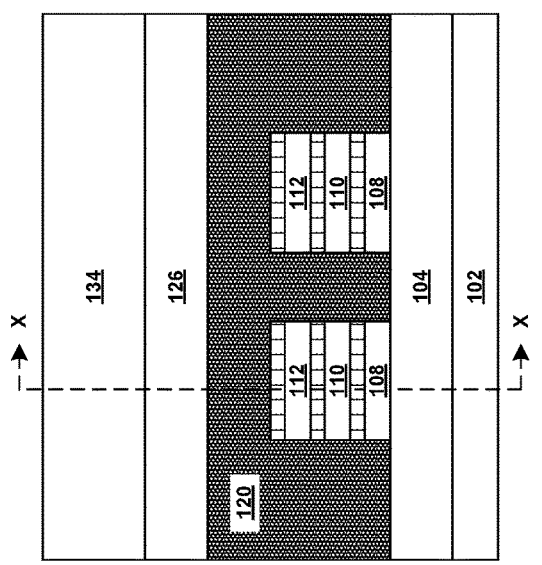
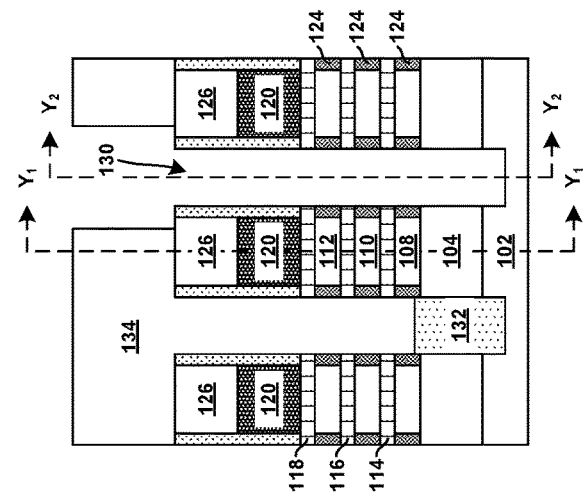
FIG. 13
SECTION X-X

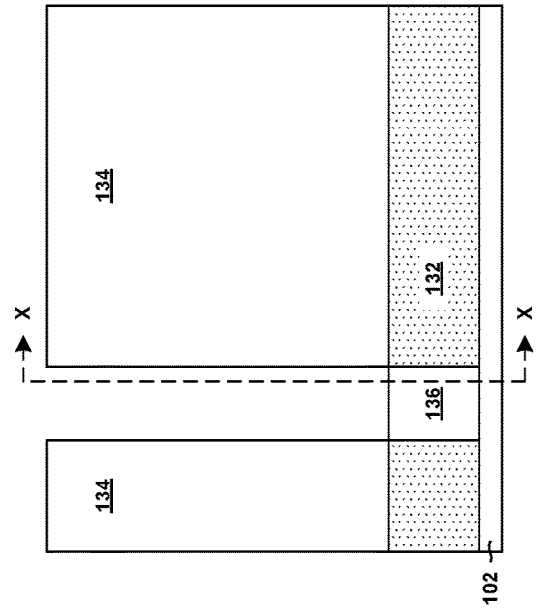
FIG. 16 SECTION X-X
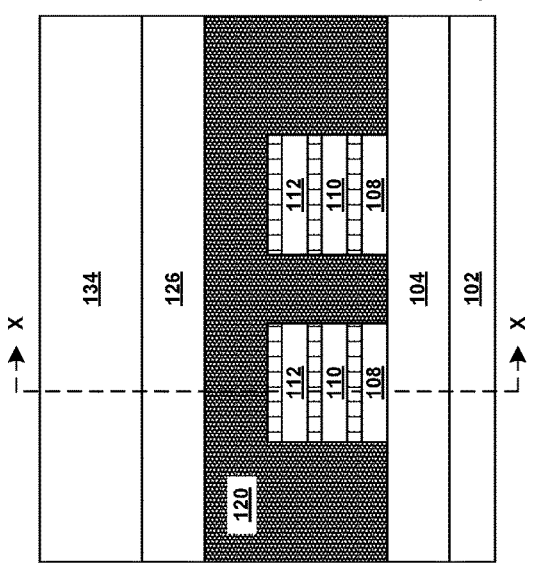
FIG. 17 SECTION Y₁-Y₁
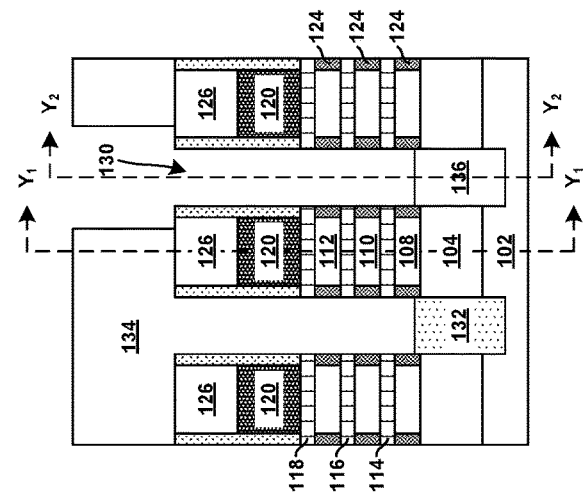
FIG. 18 SECTION Y₂-Y₂

SECTION X-X

SECTION Y₁-Y₁

SECTION Y₂-Y₂

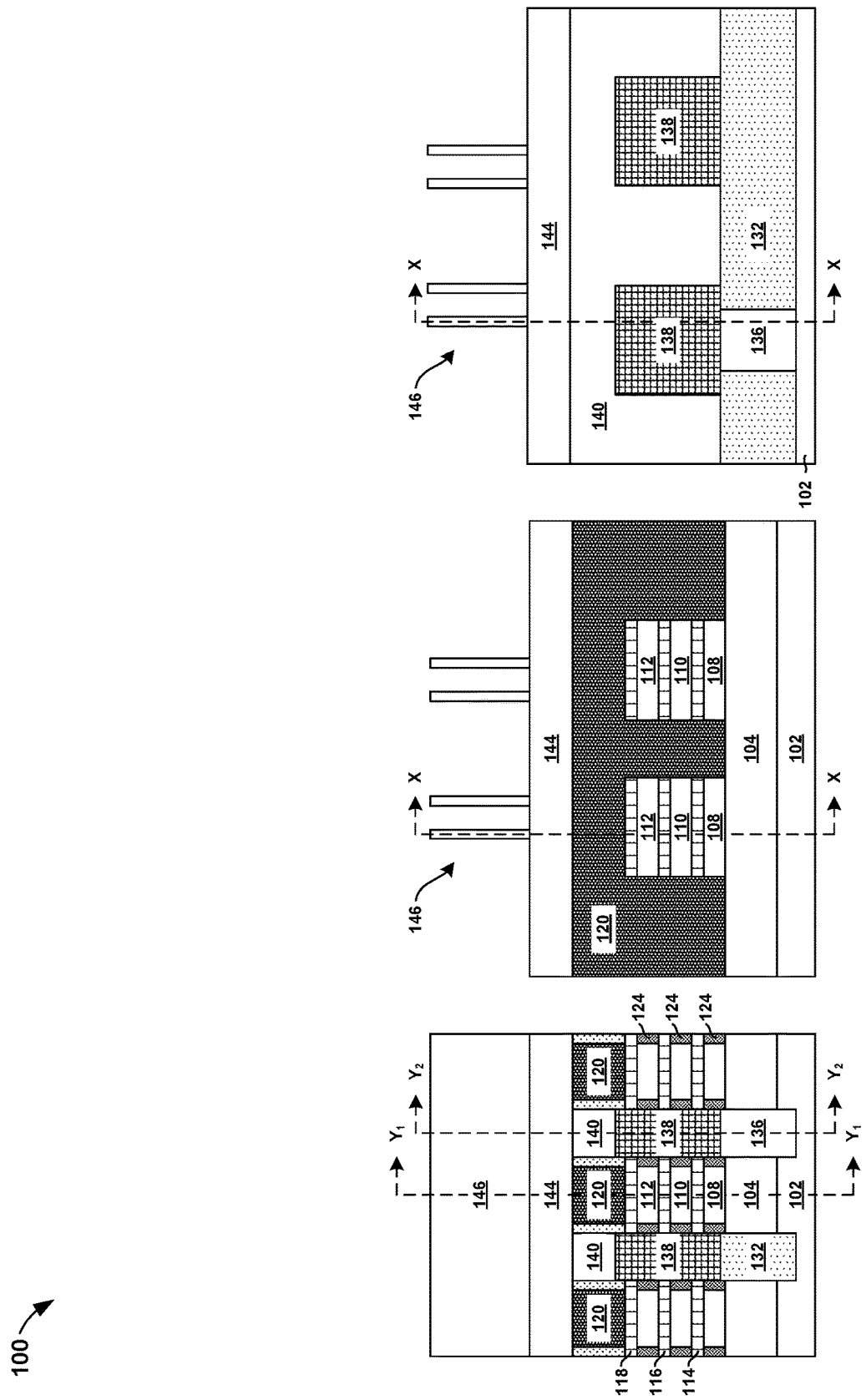

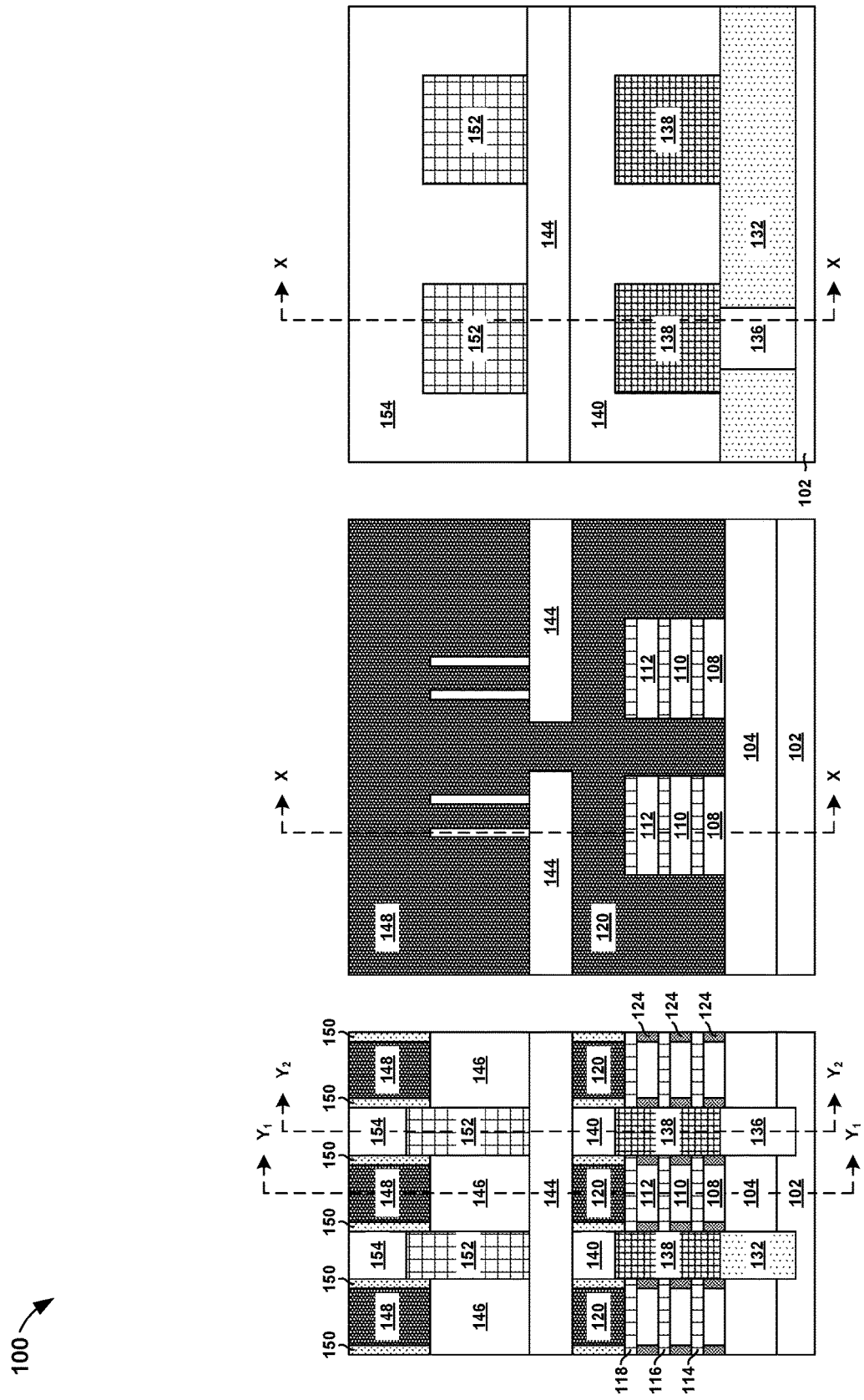

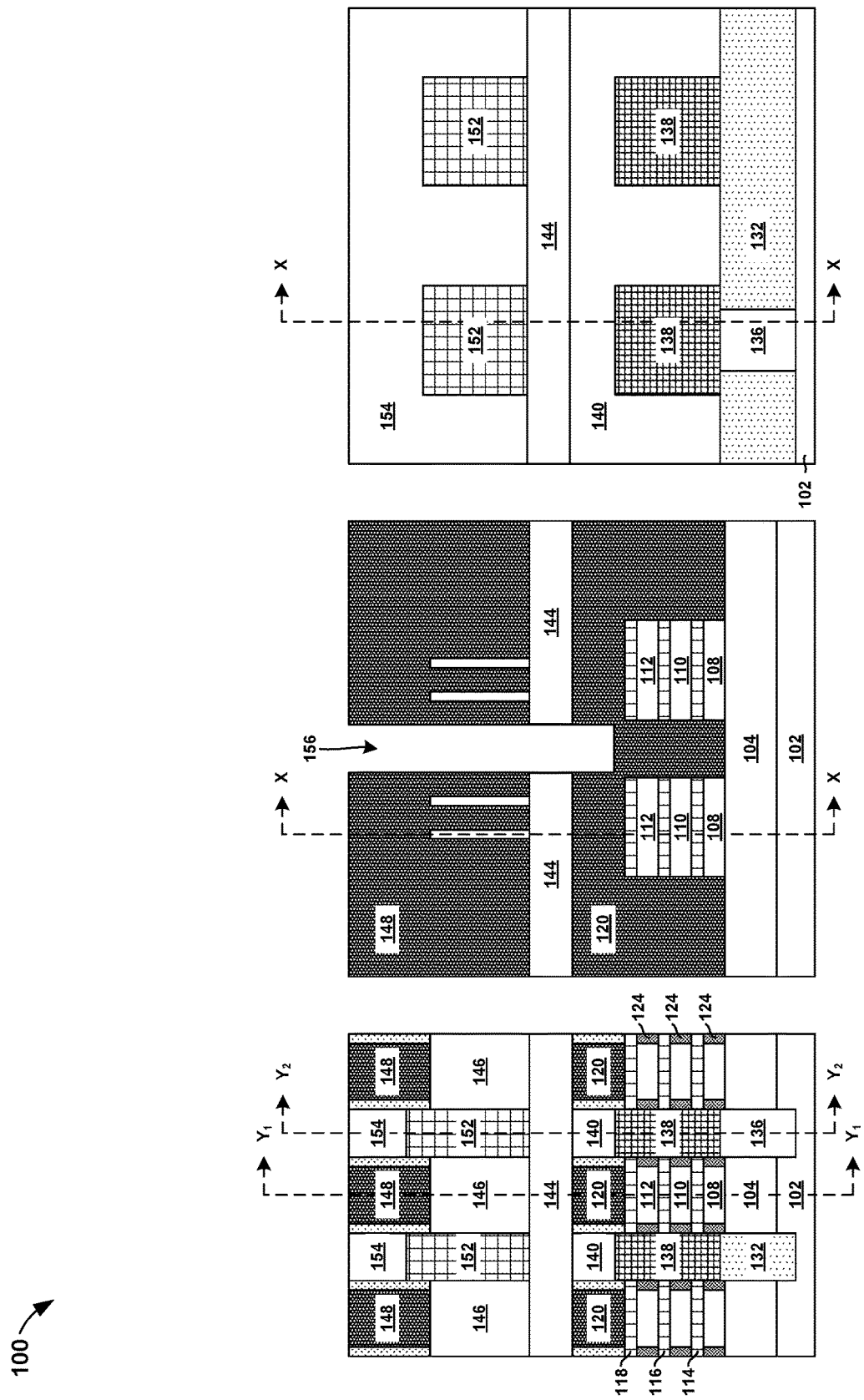

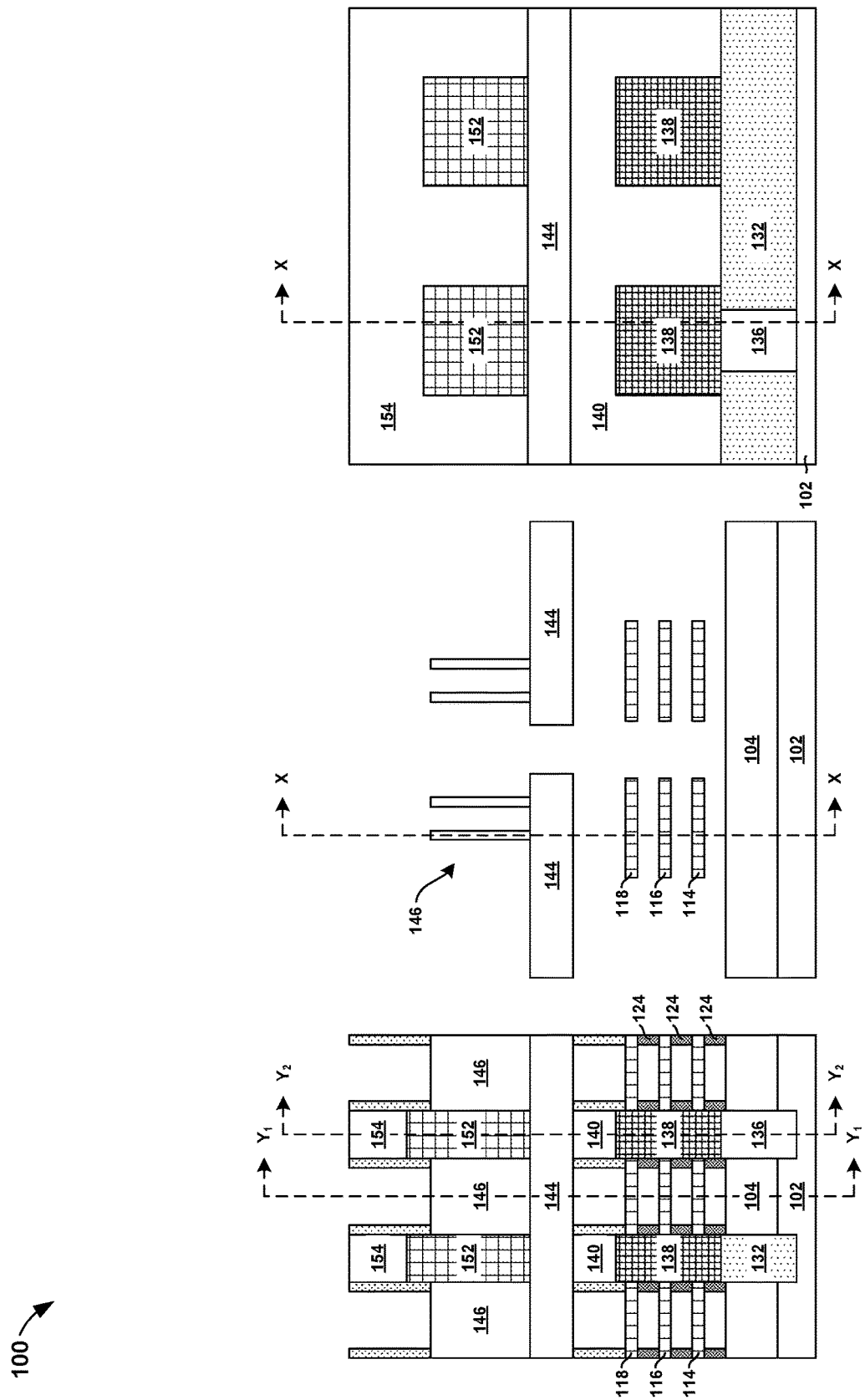

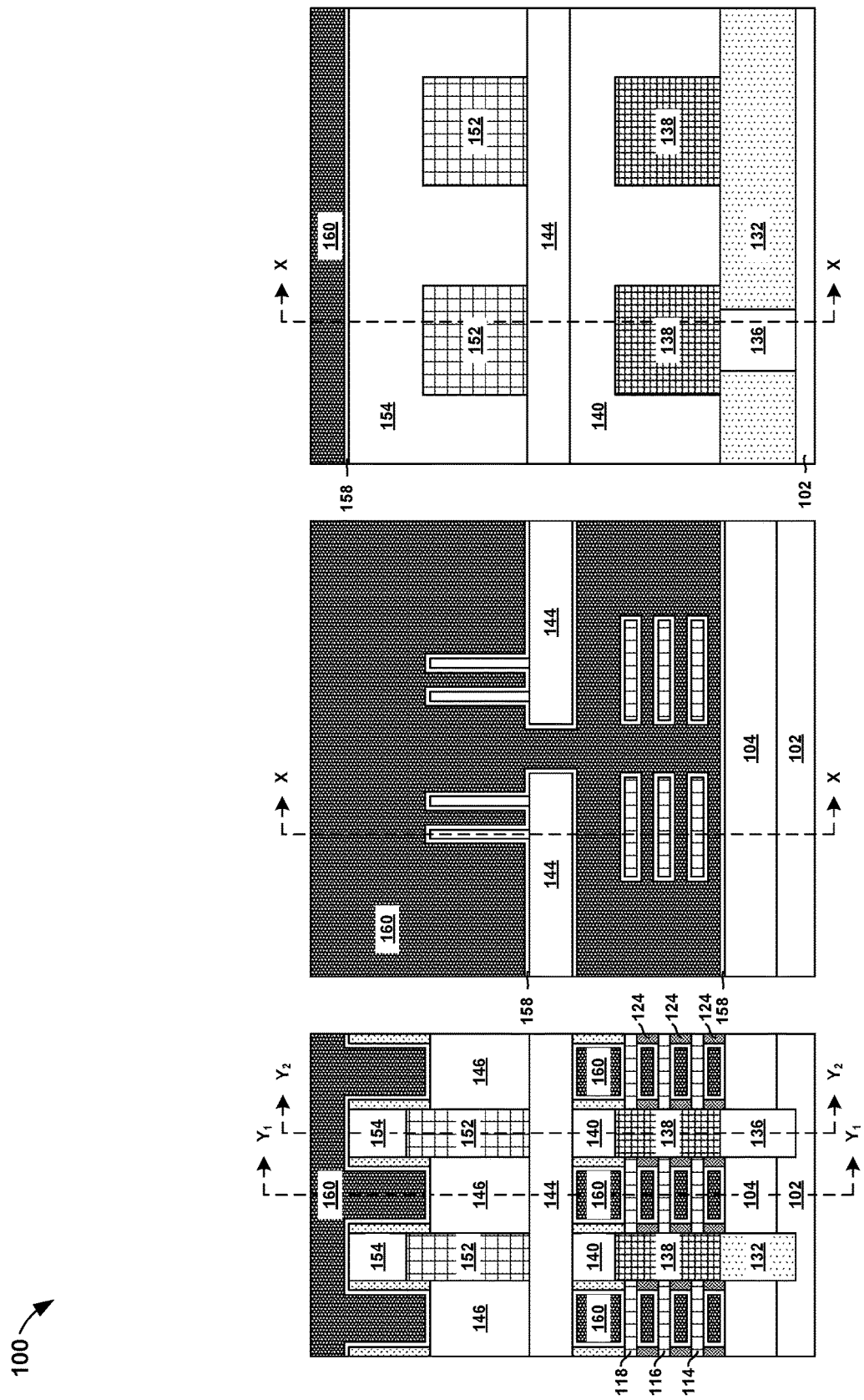

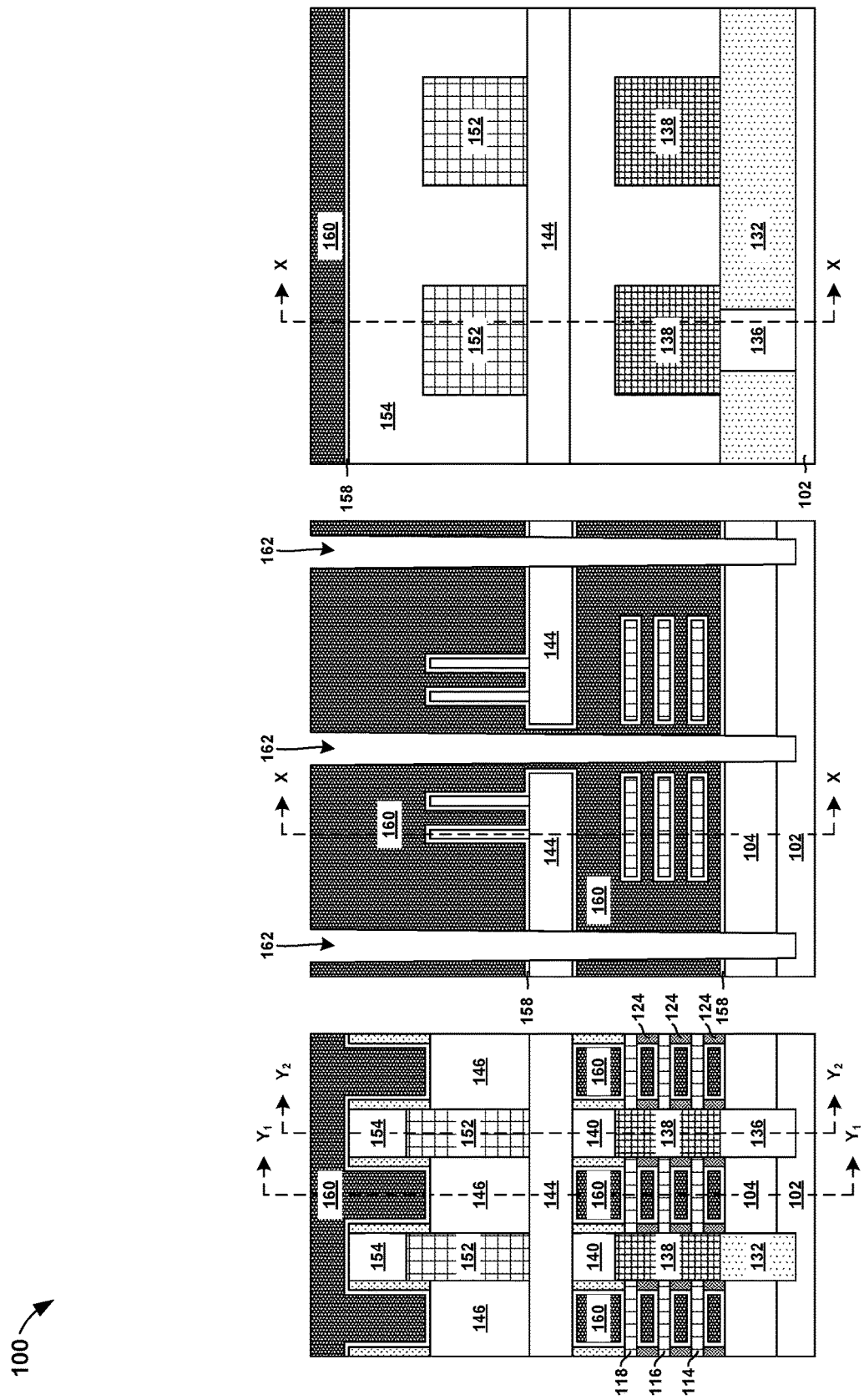

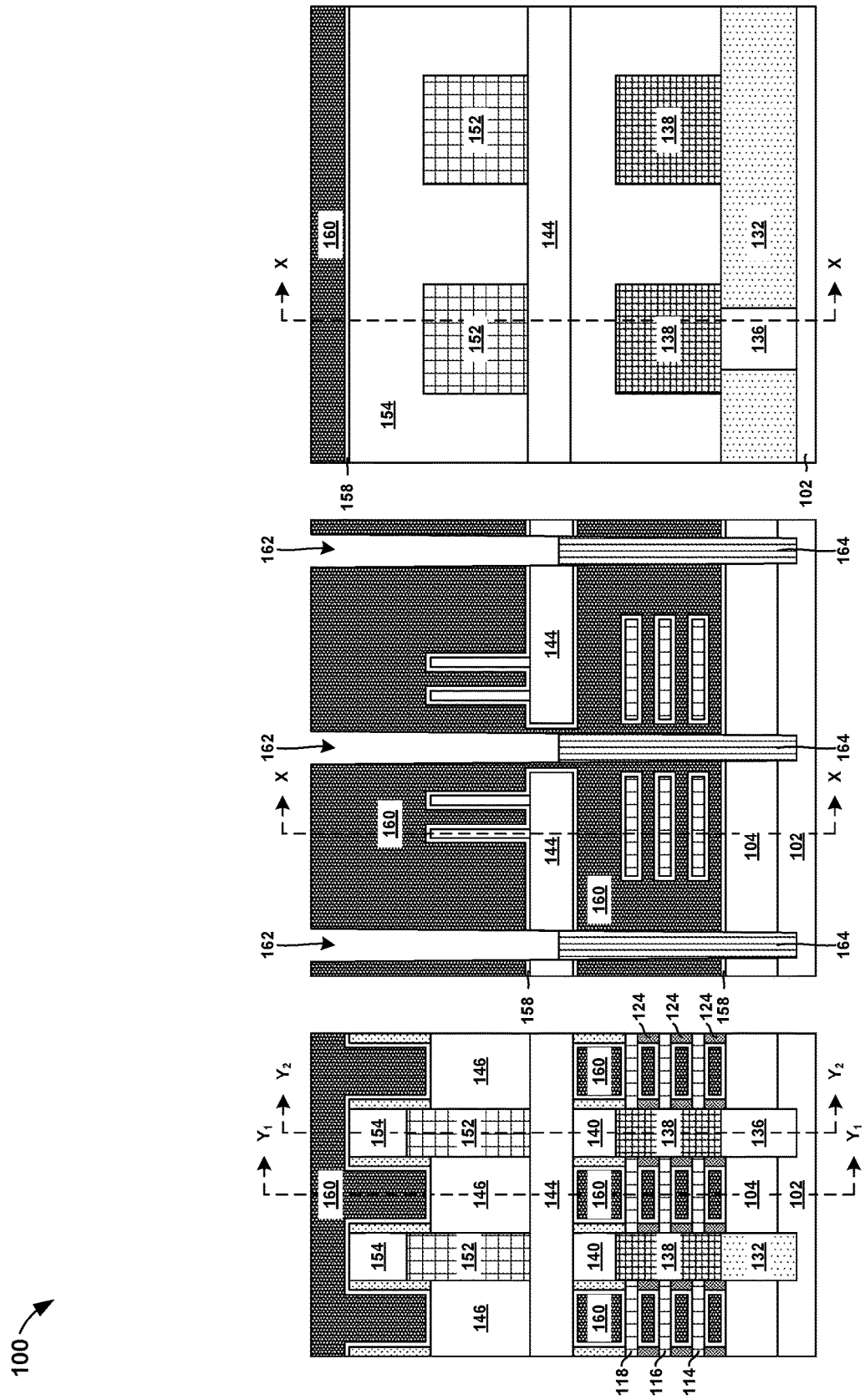
FIG. 40 SECTION X-X
FIG. 41 SECTION Y₁-Y₁
FIG. 42 SECTION Y₂-Y₂

SECTION X-X

SECTION Y₁-Y₁

SECTION Y₂-Y₂

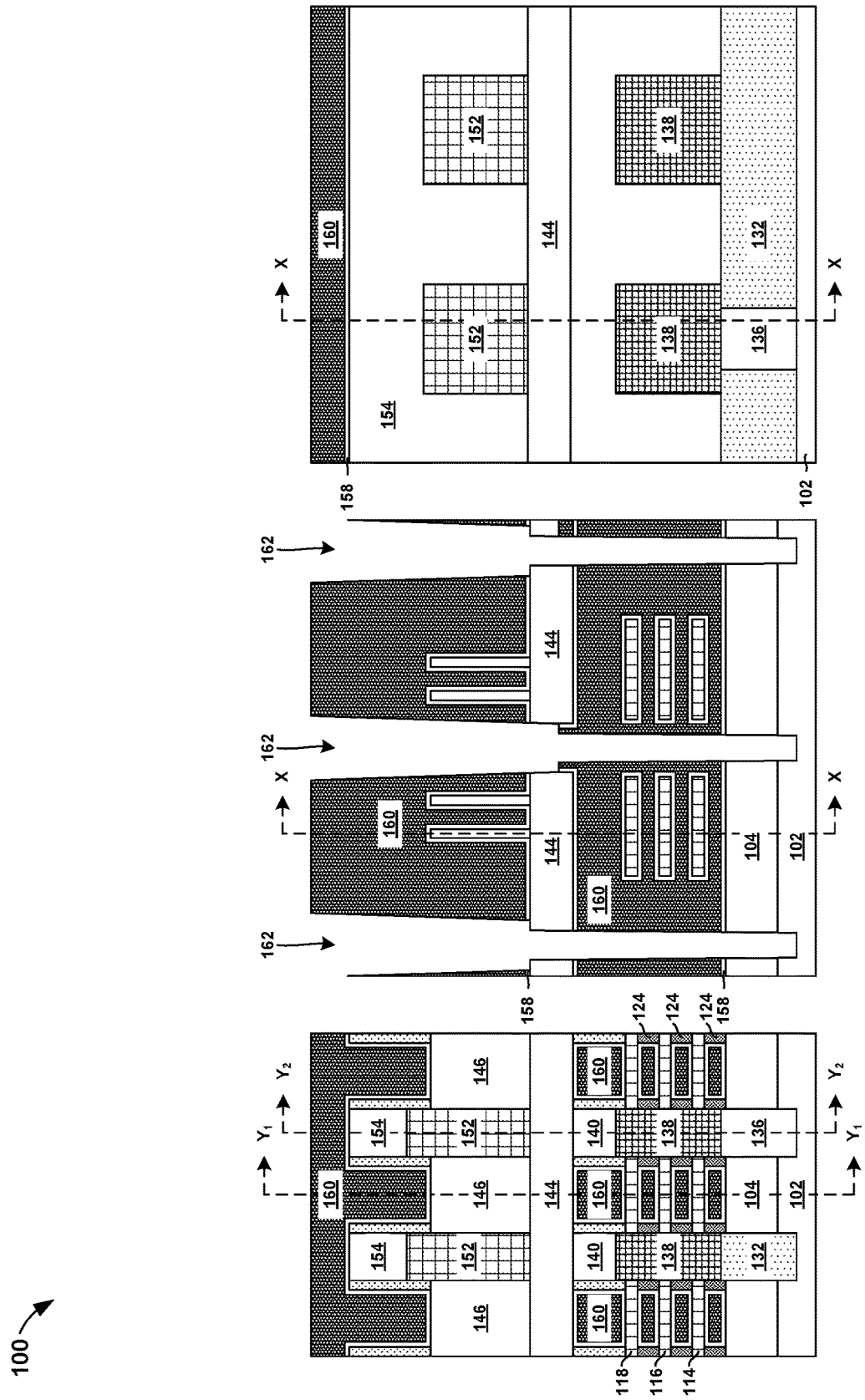
FIG. 46 SECTION X-X
FIG. 47 SECTION Y₁-Y₁
FIG. 48 SECTION Y₂-Y₂

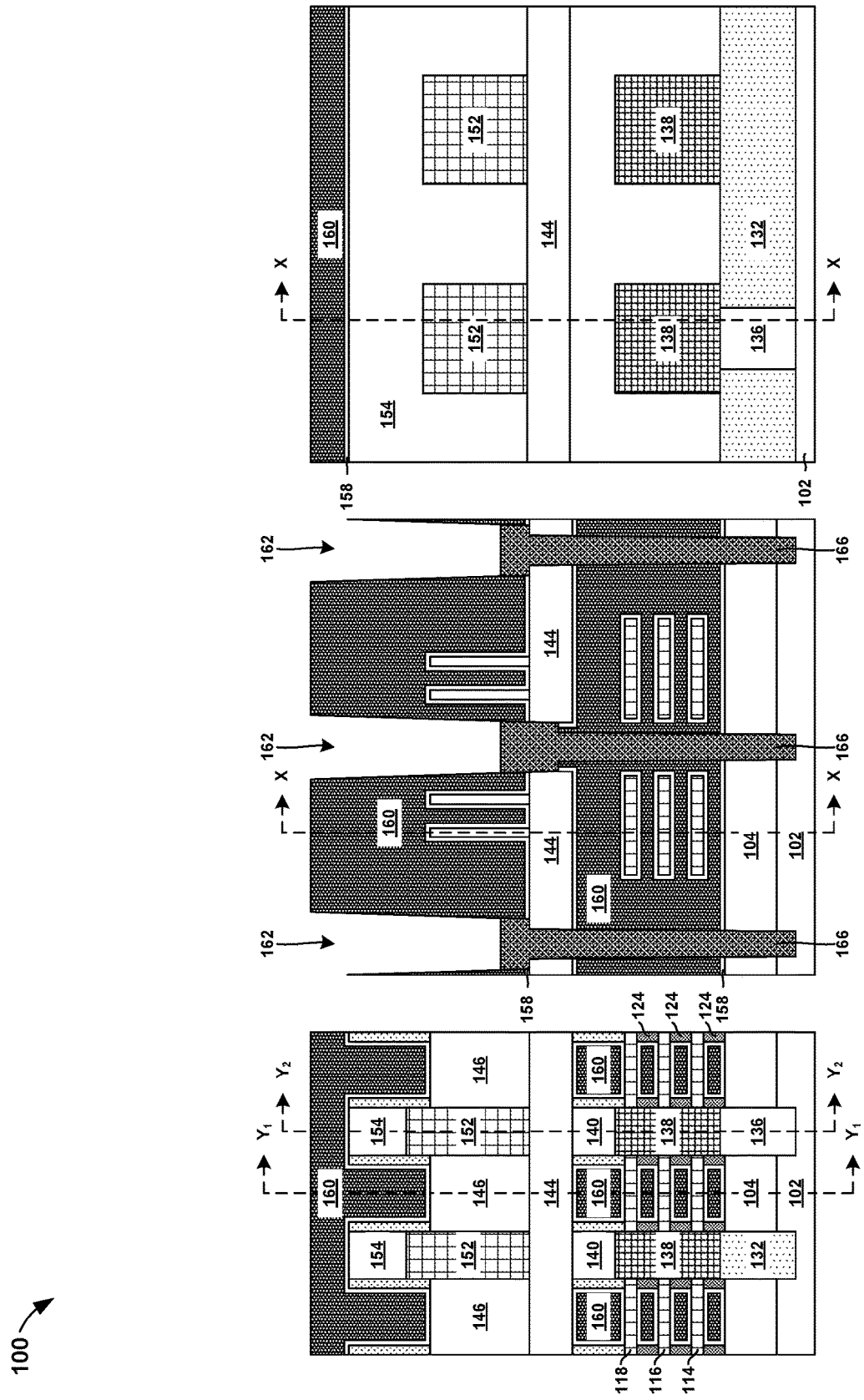

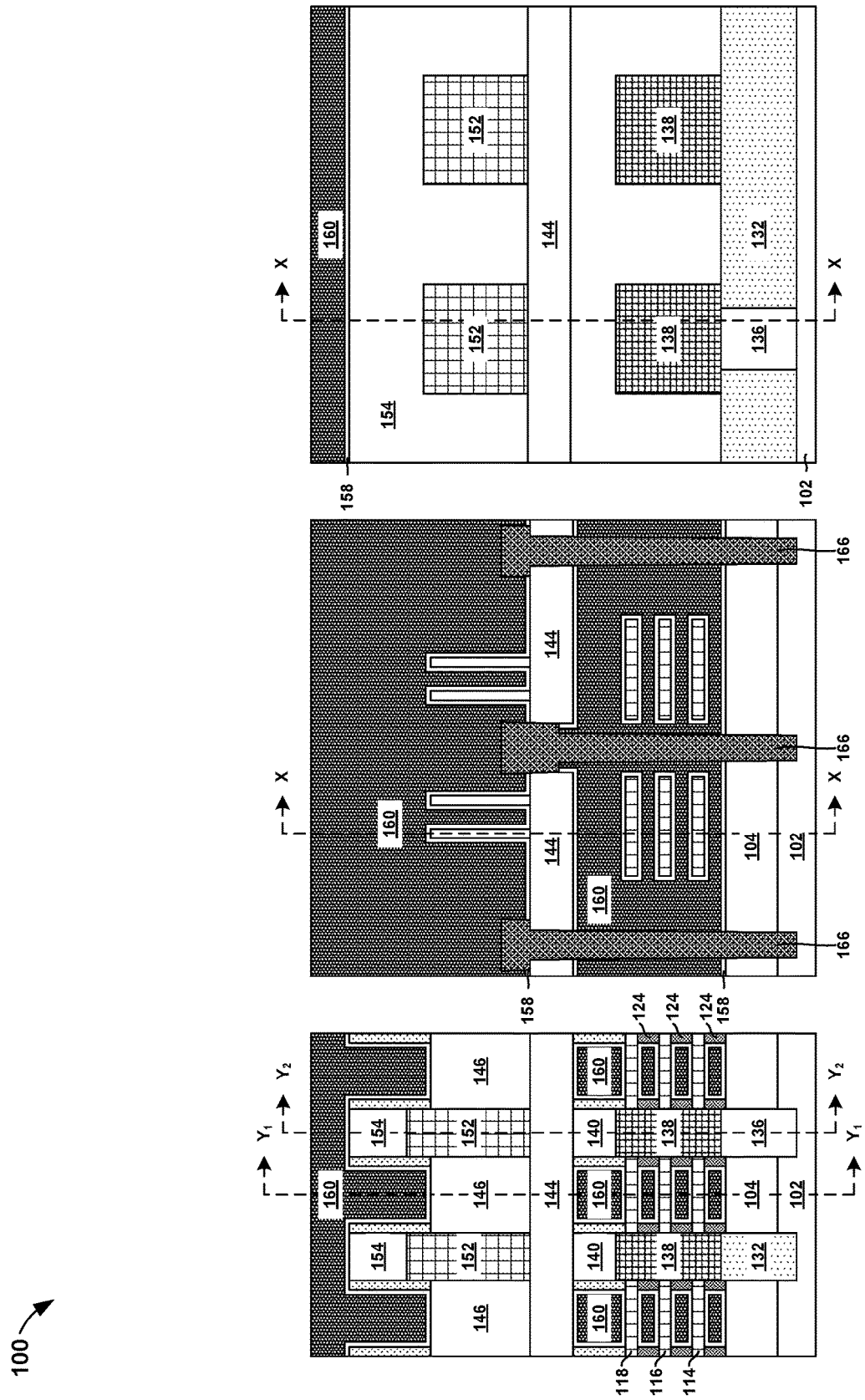

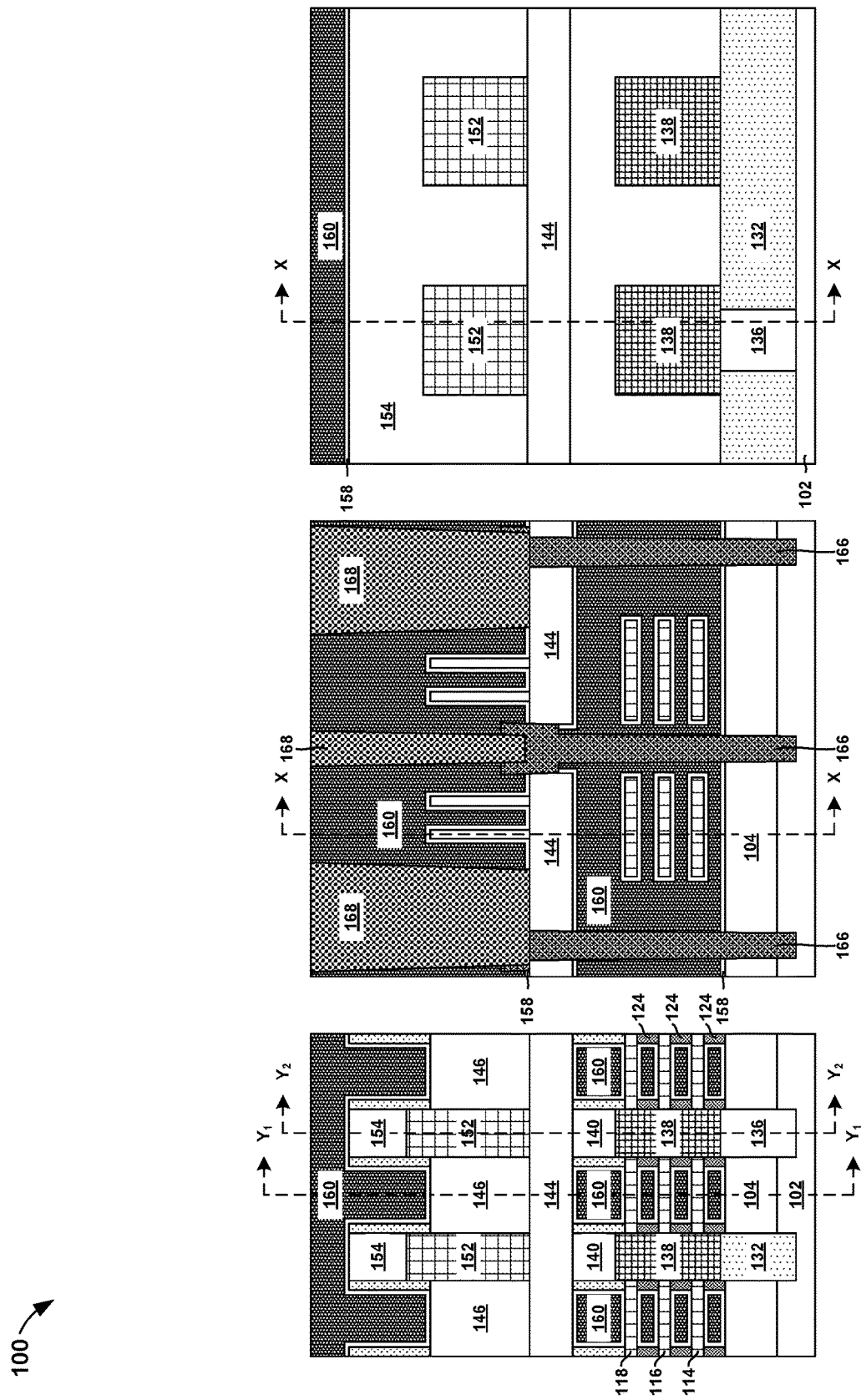

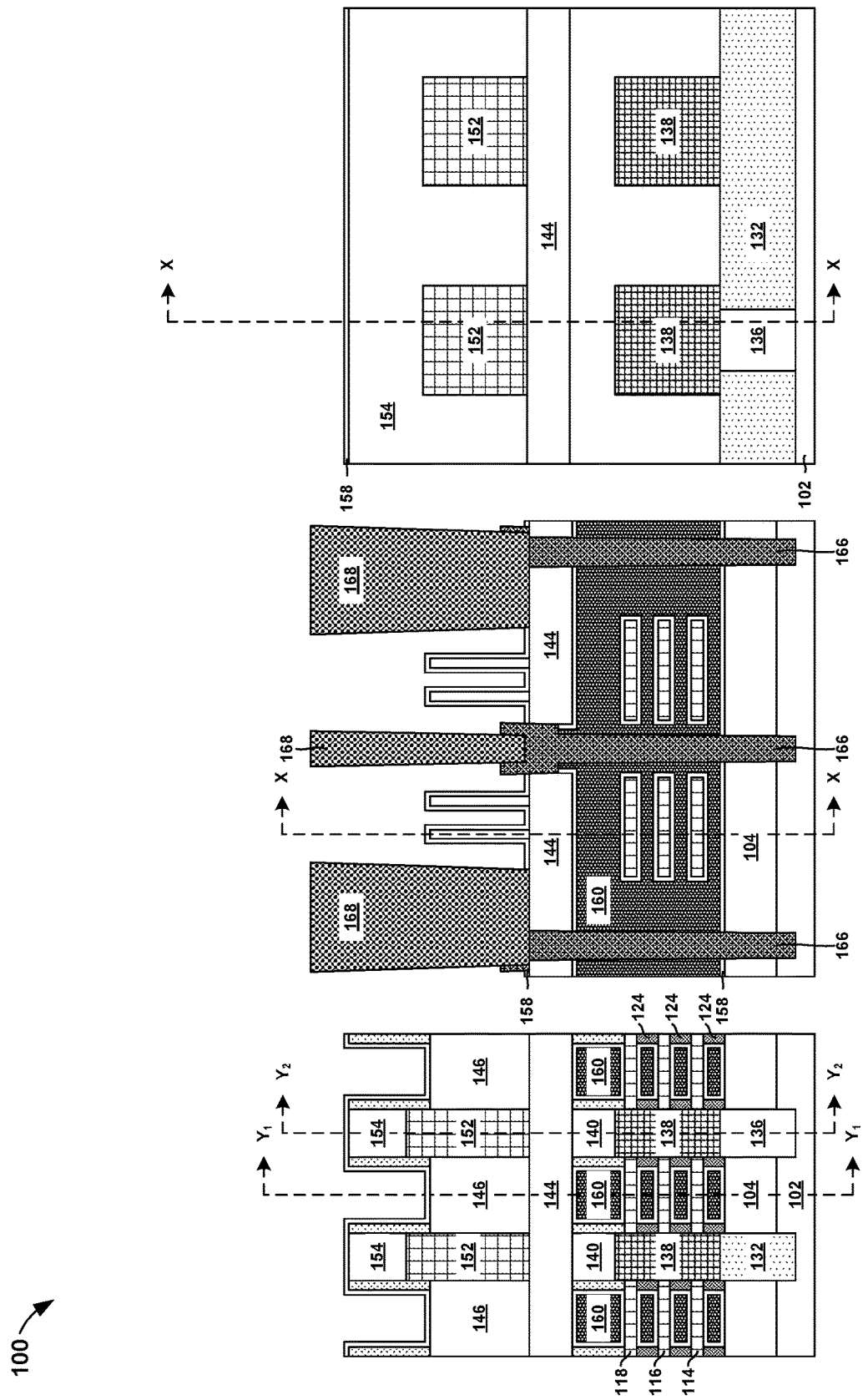

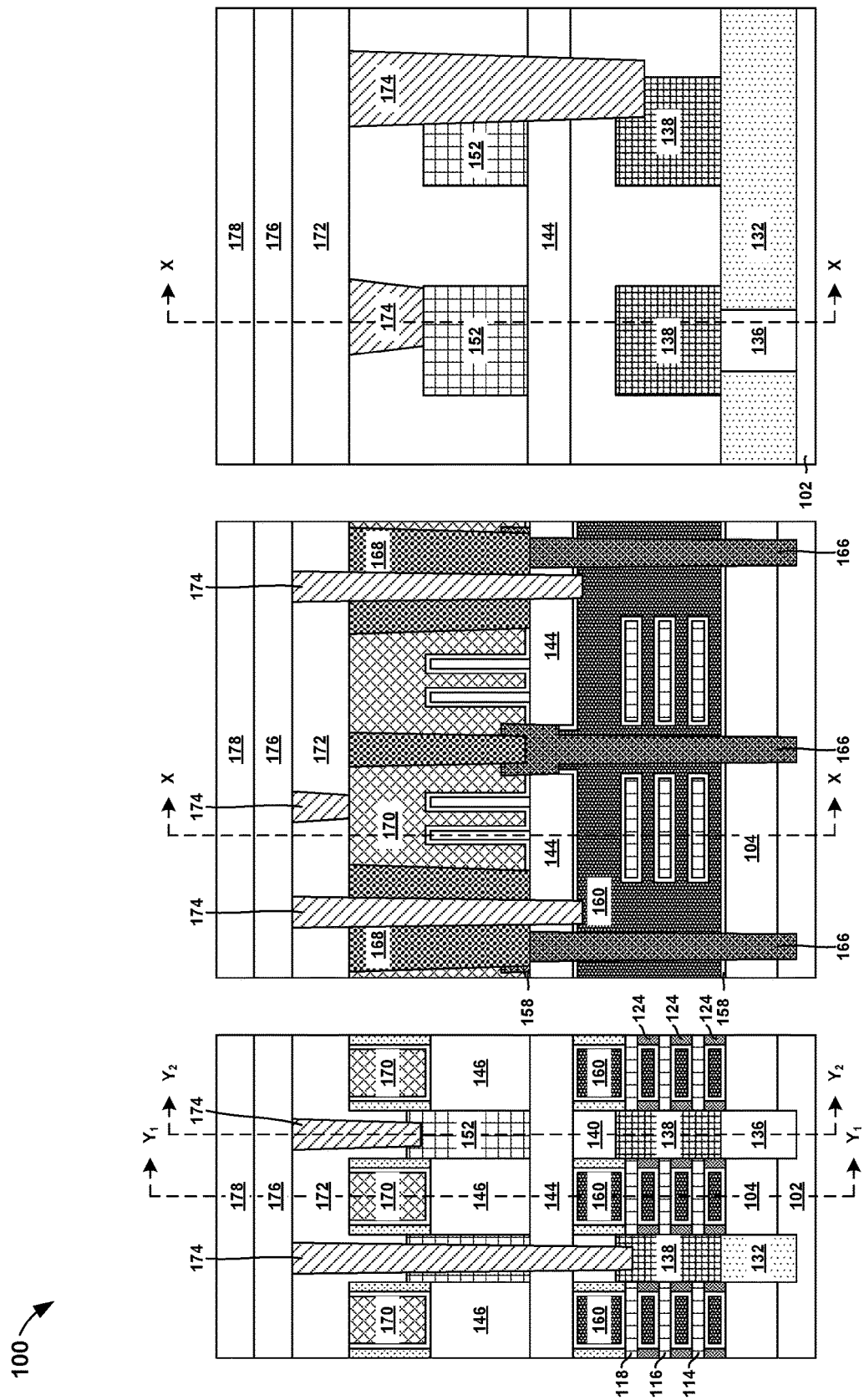

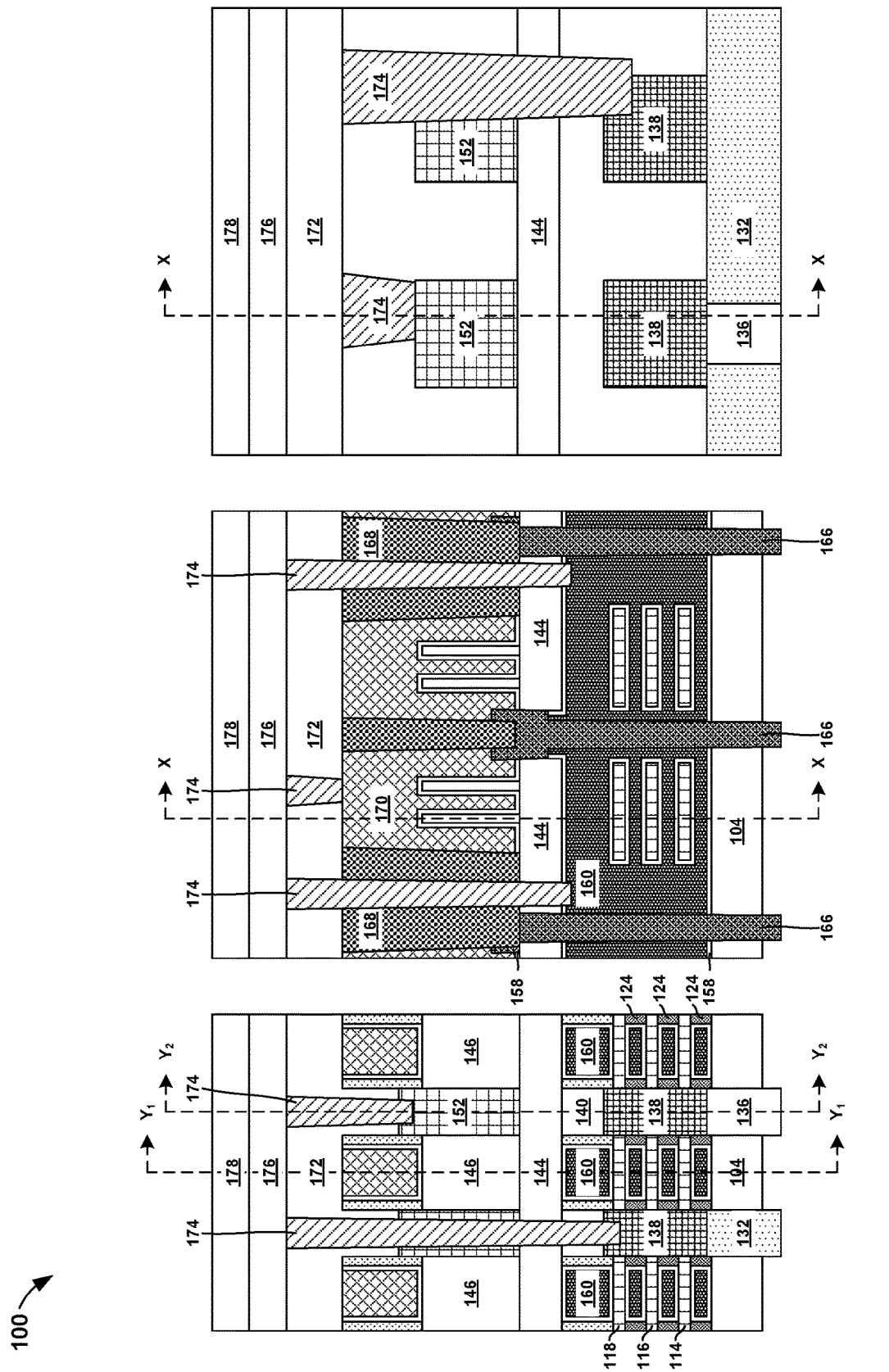

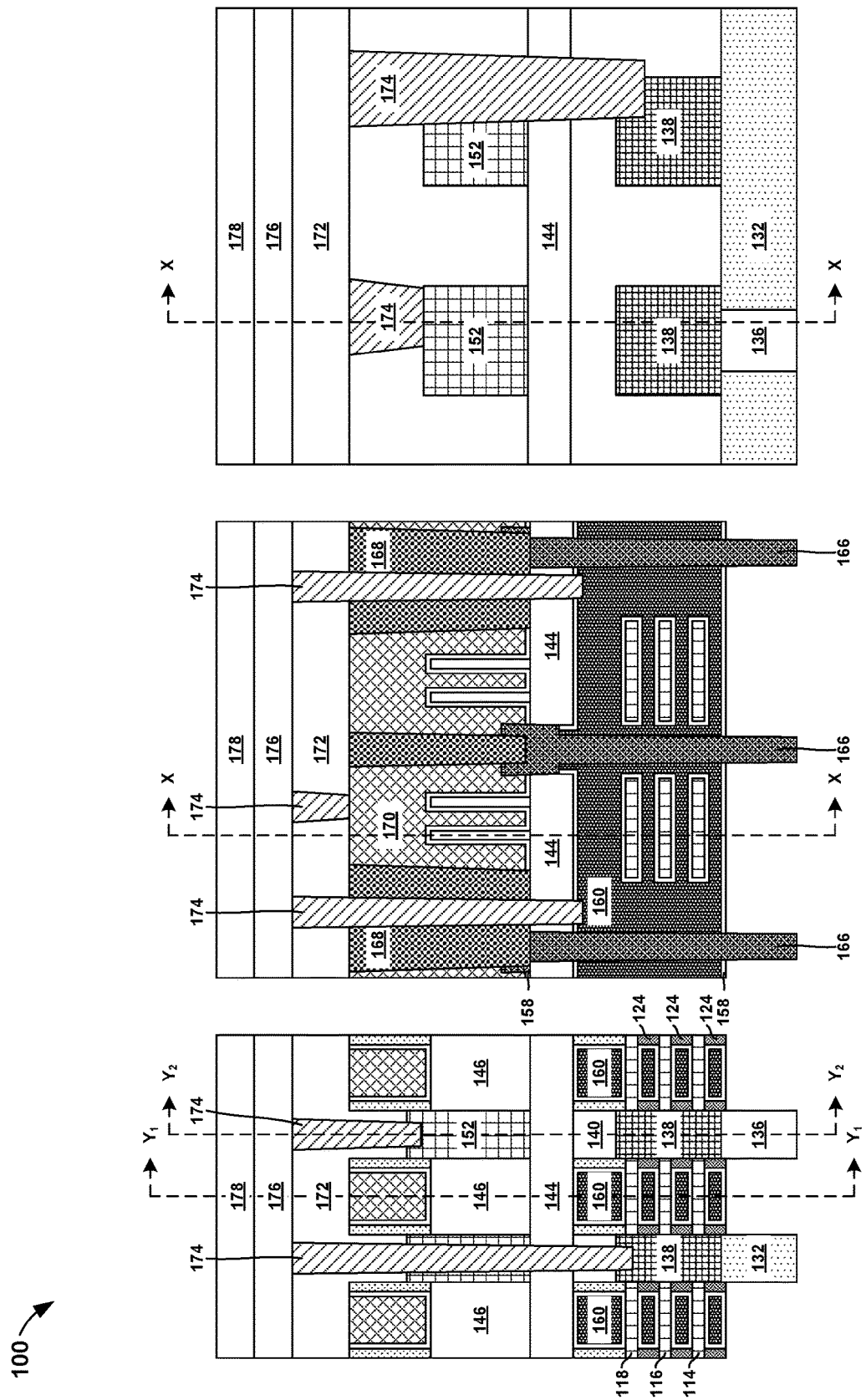
FIG. 67 SECTION X-X
FIG. 68 SECTION Y₁-Y₁
FIG. 69 SECTION Y₂-Y₂

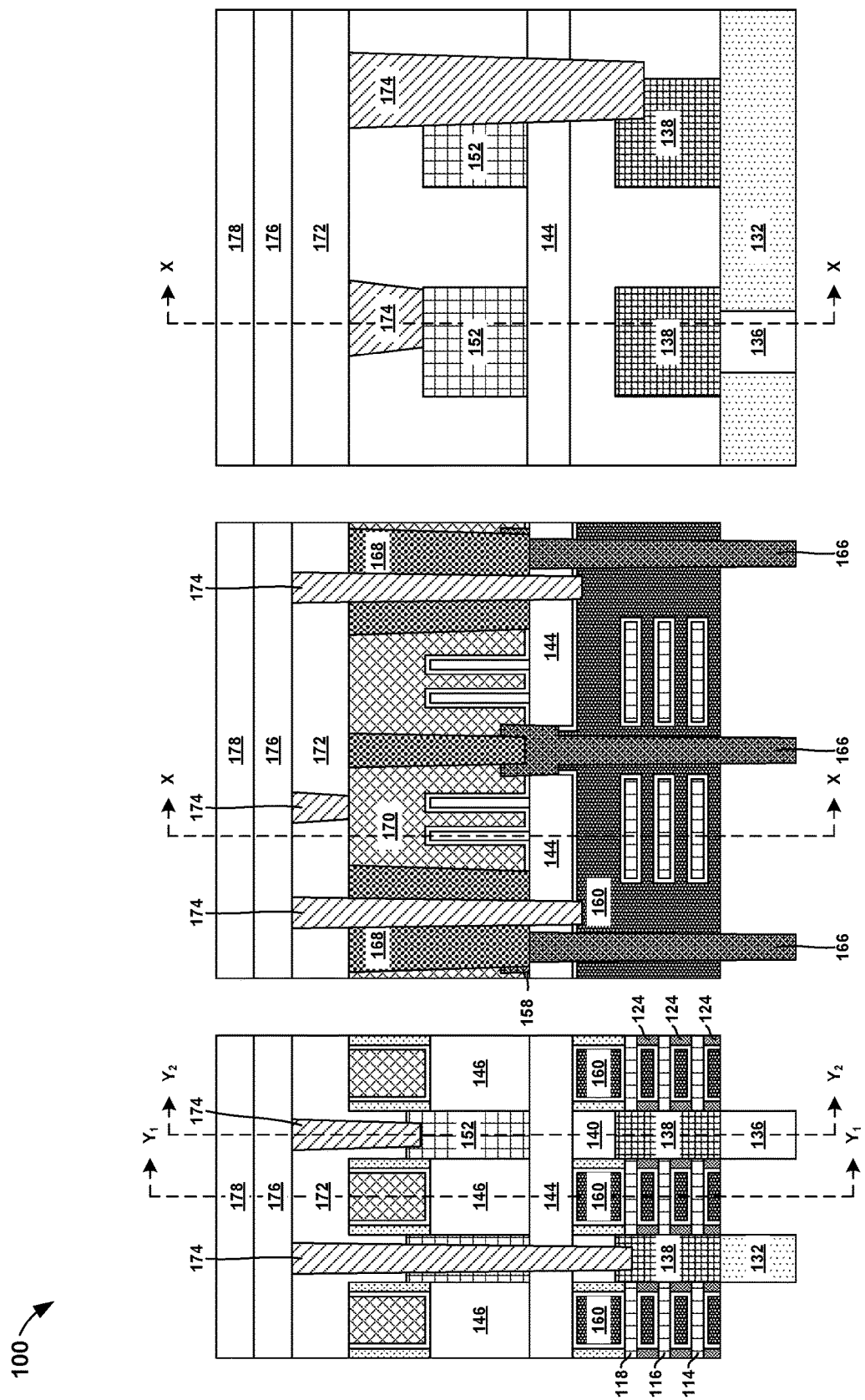

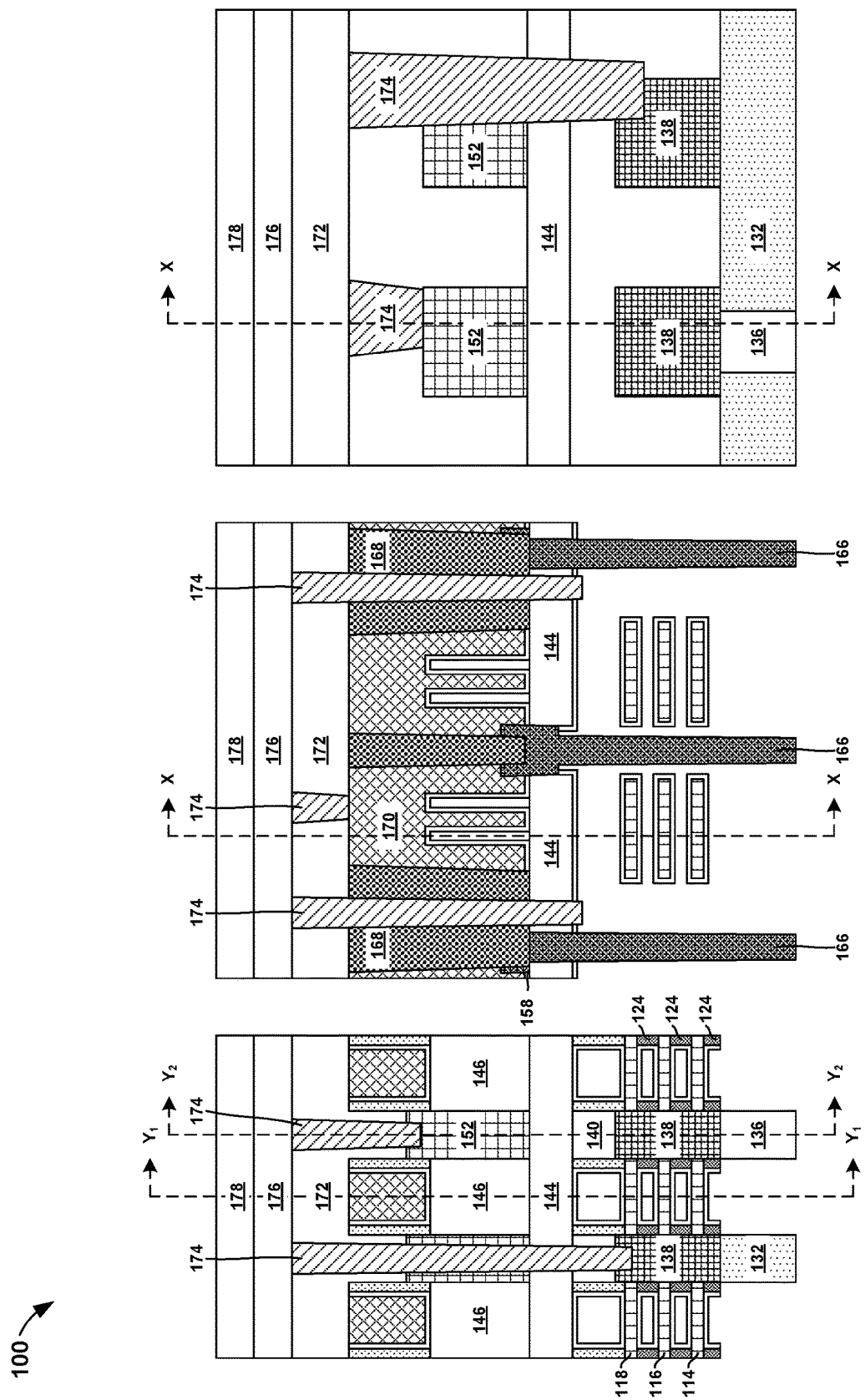

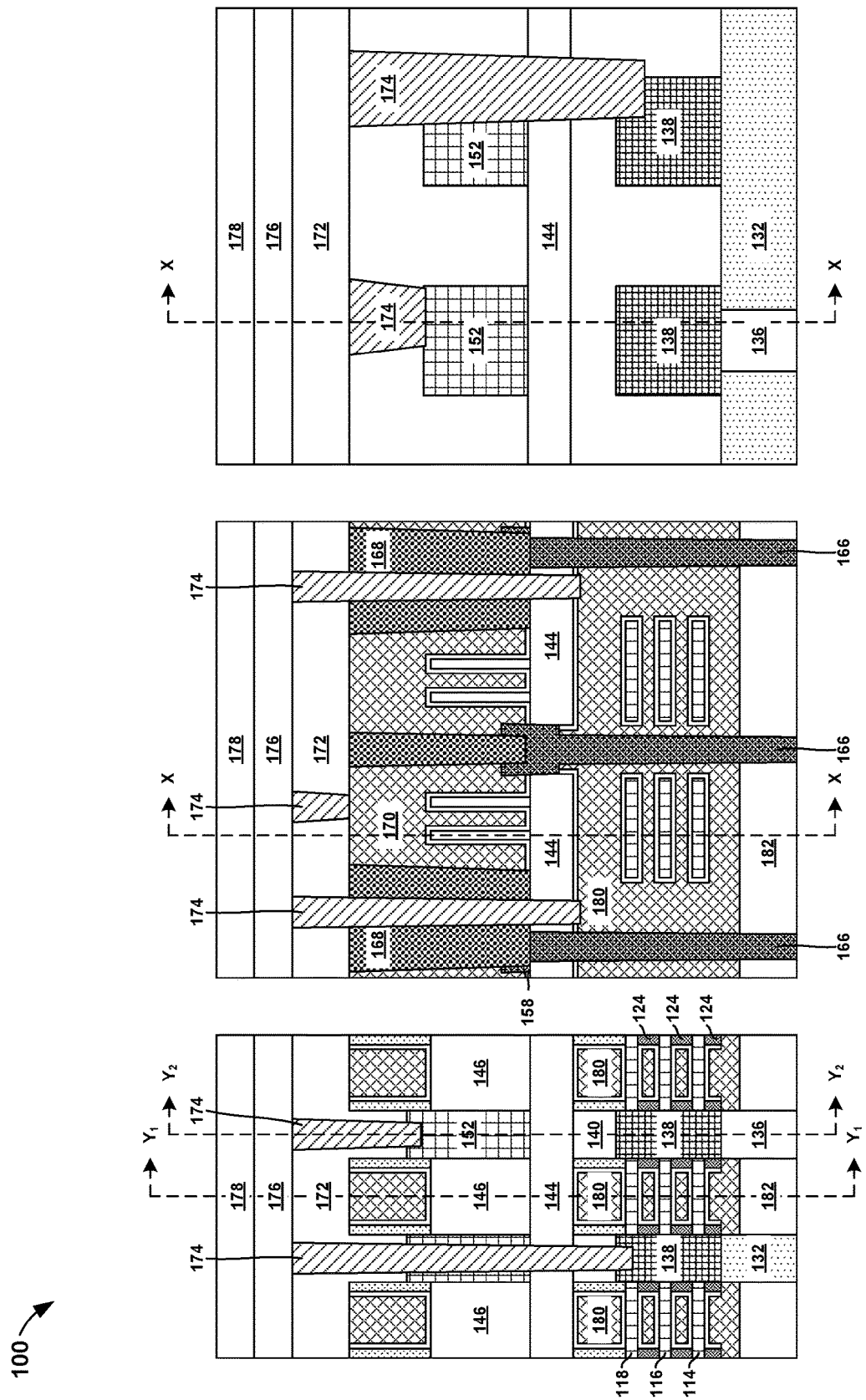

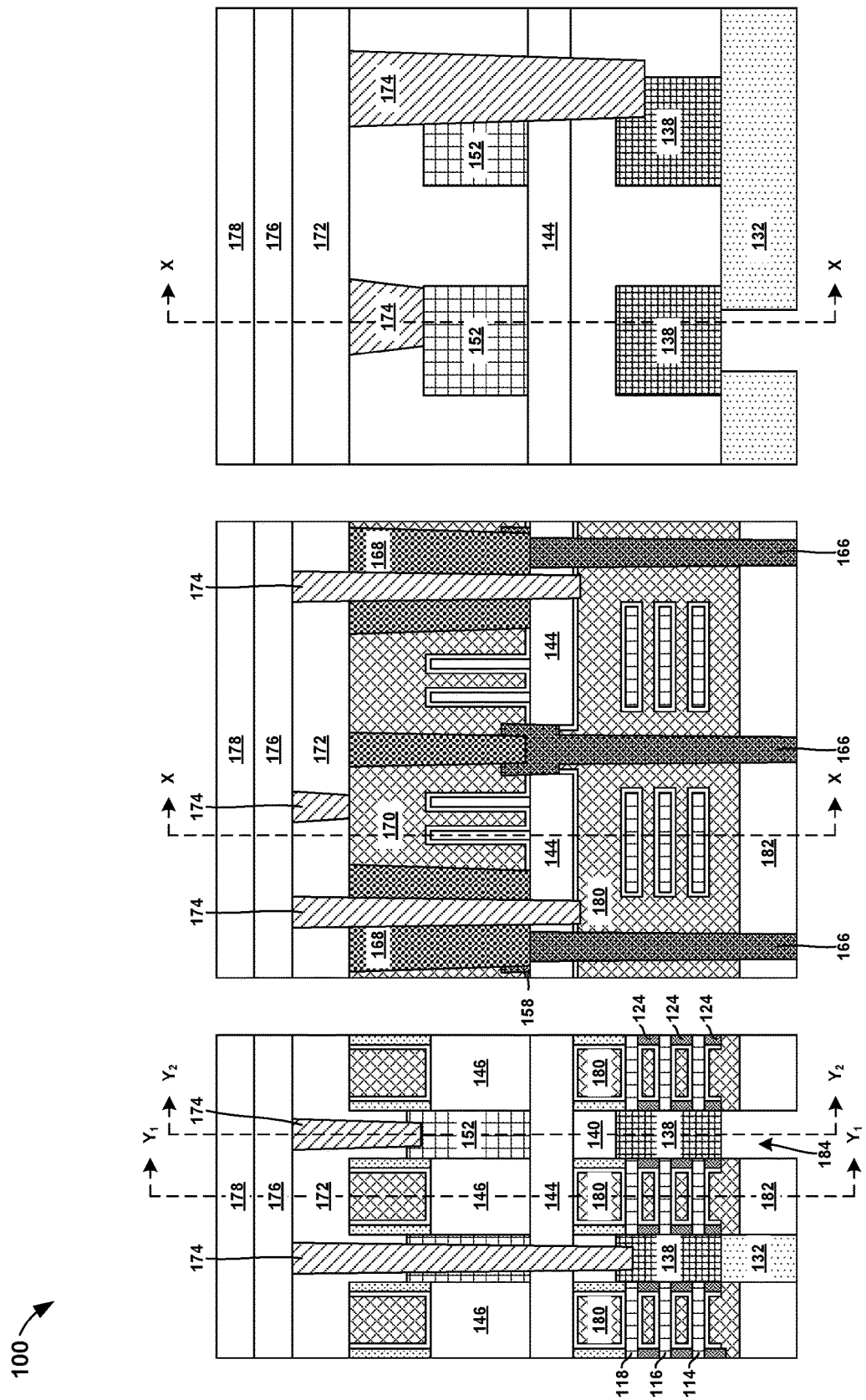

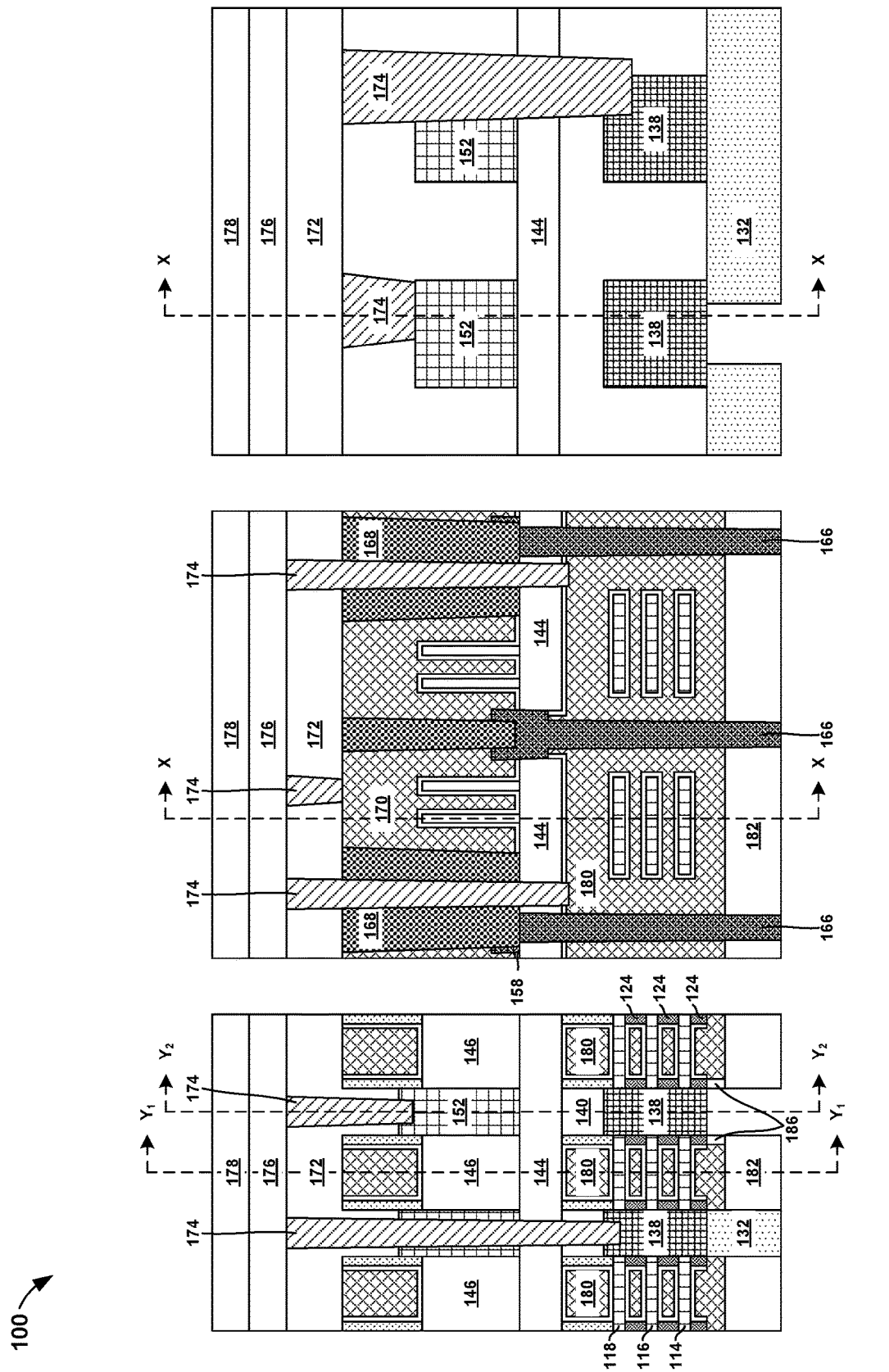

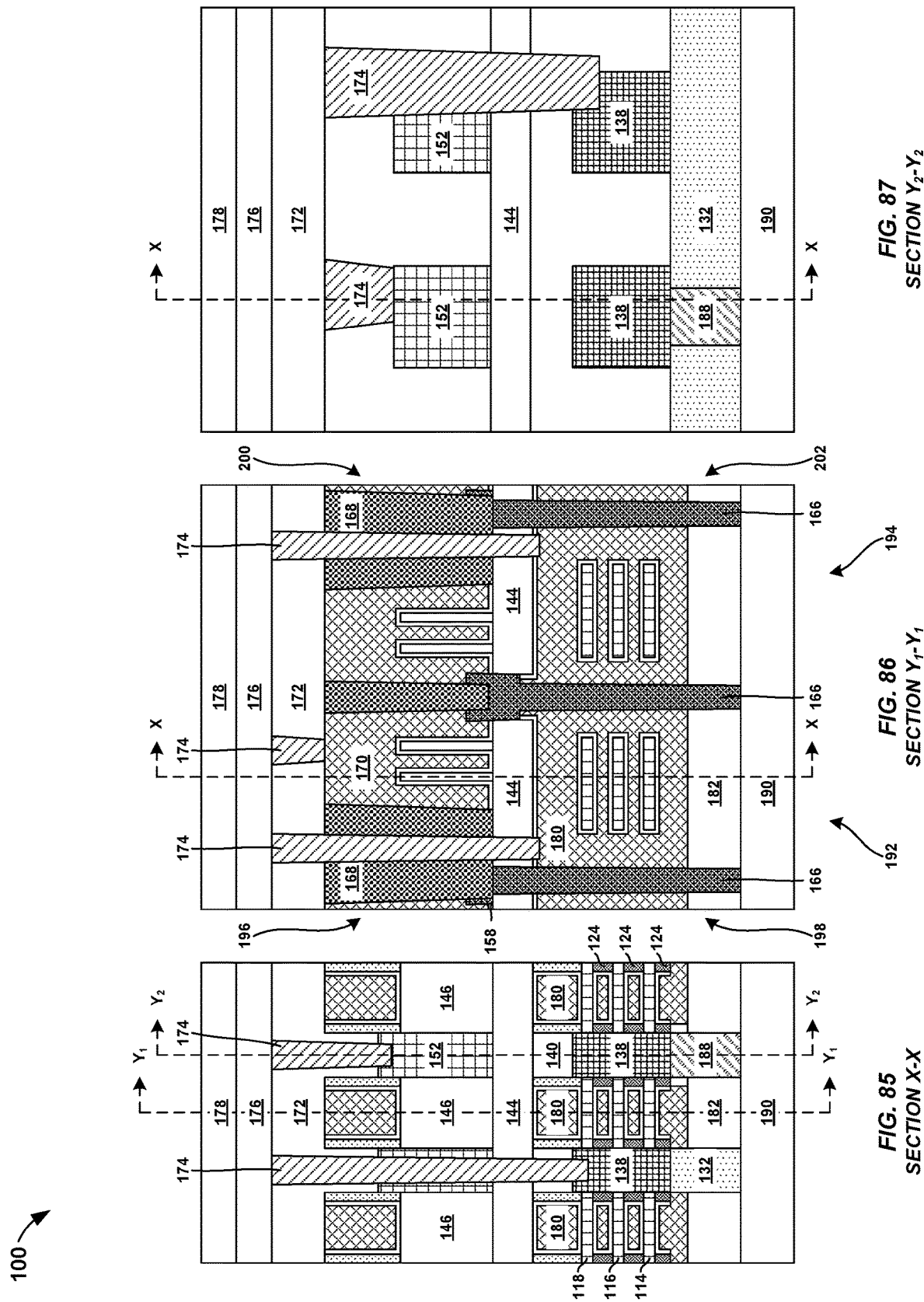

ically relates to semiconductor structures, and more particularly to stacked transistor structures having self-aligned backside contact with backside replacement metal gate.
STACKED TRANSISTORS HAVING SELF ALIGNED BACKSIDE CONTACT WITH BACKSIDE REPLACEMENT METAL GATE

BACKGROUND

The present invention generally relates to semiconductor structures, and more particularly to stacked transistor structures having self-aligned backside contact with backside replacement metal gate.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where nFET and pFET nanowires/nanosheets are vertically stacked on top of each other.

SUMMARY

According to an embodiment of the present invention, a semiconductor structure is provided. The semiconductor structure may include stacked transistor structures each including a top device stacked directly above a bottom device, and a placeholder dielectric and a backside gate contact within a dielectric capping layer beneath the stacked transistor structures, where the placeholder dielectric is directly below a first bottom source drain region, and the backside gate contact is directly below a second bottom source drain region.

According to another embodiment of the present invention, a semiconductor structure is provided. The semiconductor structure may include a first stacked transistor structure including a first top device stacked directly above a first bottom device, a second stacked transistor structure adjacent to the first stacked transistor structure, the second stacked transistor structure including a second top device stacked directly above a second bottom device, and a placeholder dielectric and a backside gate contact within a dielectric capping layer beneath both the first stacked transistor structure and the second stacked transistor structure, where the placeholder dielectric is directly below a first bottom source drain region of the first stacked transistor structure, and the backside gate contact is directly below a bottom second source drain region of the second stacked transistor structure.

According to another embodiment of the present invention, a semiconductor structure is provided. The semiconductor structure may include stacked transistor structures each including a top device stacked directly above a bottom device, a placeholder dielectric and a backside gate contact within a dielectric capping layer beneath the stacked transistor structures, where the placeholder dielectric is directly below a first bottom source drain region, and the backside gate contact is directly below a second bottom source drain region, and a bottom gate cut insulator extending through the dielectric capping layer, where the bottom gate cut insulator directly contacts a gate dielectric layer.

BRIEF DESCRIPTION OF THE DRAWINGS

The following detailed description, given by way of example and not intended to limit the invention solely thereto, will best be appreciated in conjunction with the accompanying drawings, in which:

FIGS. 1, 2, and 3 are cross-sectional views of a semiconductor structure during an intermediate step of a method of fabricating a vertical transistor with reduced cell height according to an exemplary embodiment;

FIGS. 7, 8, and 9 are cross-sectional views of a semiconductor structure after selectively recessing the openings into the oxide isolation layer and the silicon substrate according to an exemplary embodiment;

FIGS. 10, 11, and 12 are cross-sectional views of a semiconductor structure after forming a placeholder dielectric in the openings according to an exemplary embodiment;

FIGS. 13, 14, and 15 are cross-sectional views of a semiconductor structure after forming a mask and removing portions of the placeholder dielectric according to an exemplary embodiment;

FIGS. 16, 17, and 18 are cross-sectional views of a semiconductor structure after forming a placeholder metal according to an exemplary embodiment;

FIGS. 22, 23, and 24 are cross-sectional views of a semiconductor structure after forming fins according to an exemplary embodiment;

FIGS. 25, 26, and 27 are cross-sectional views of a semiconductor structure after forming a top sacrificial gate, top gate spacers, top source drain regions, and a top dielectric material according to an exemplary embodiment;

FIGS. 28, 29, and 30 are cross-sectional views of a semiconductor structure after forming an access opening according to an exemplary embodiment;

FIGS. 31, 32, and 33 are cross-sectional views of a semiconductor structure after removing both the bottom sacrificial gate and the top sacrificial gate and removing the silicon germanium sacrificial nanosheets according to an exemplary embodiment;

FIGS. 34, 35, and 36 are cross-sectional views of a semiconductor structure after forming a gate dielectric layer and a capping layer according to an exemplary embodiment;

FIGS. 37, 38, and 39 are cross-sectional views of a semiconductor structure after forming gate cut trenches according to an exemplary embodiment;

FIGS. 40, 41, and 42 are cross-sectional views of a semiconductor structure after forming placeholder plug masks according to an exemplary embodiment;

FIGS. 46, 47, and 48 are cross-sectional views of a semiconductor structure after removing the placeholder plug masks according to an exemplary embodiment;

FIGS. 49, 50, and 51 are cross-sectional views of a semiconductor structure after forming bottom gate cut insulators according to an exemplary embodiment;

FIGS. 52, 53, and 54 are cross-sectional views of a semiconductor structure after refilling the gate cut trenches according to an exemplary embodiment;

FIGS. 55, 56, and 57 are cross-sectional views of a semiconductor structure after forming top gate cut insulators according to an exemplary embodiment;

FIGS. 58, 59, and 60 are cross-sectional views of a semiconductor structure after removing the capping layer according to an exemplary embodiment;

FIGS. 61, 62, and 63 are cross-sectional views of a semiconductor structure after forming functional top gates, a middle-of-line dielectric, contact structures, a back-end-of-line and securing a carrier wafer according to an exemplary embodiment;

FIGS. 64, 65, and 66 are cross-sectional views of a semiconductor structure after flipping the structure and recessing the substrate according to an exemplary embodiment;

FIGS. 67, 68, and 69 are cross-sectional views of a semiconductor structure after removing the oxide isolation layer according to an exemplary embodiment;

FIGS. 70, 71, and 72 are cross-sectional views of a semiconductor structure after removing the gate dielectric layer according to an exemplary embodiment;

FIGS. 73, 74, and 75 are cross-sectional views of a semiconductor structure after removing remaining portions of the capping layer according to an exemplary embodiment;

FIGS. 76, 77, and 78 are cross-sectional views of a semiconductor structure after forming functional bottom gates and a self-aligned cap according to an exemplary embodiment;

FIGS. 79, 80, and 81 are cross-sectional views of a semiconductor structure after removing the placeholder metal to create backside trenches according to an exemplary embodiment;

FIGS. 82, 83, and 84 are cross-sectional views of a semiconductor structure after recessing a portion of the functional bottom gates and forming bottom inner spacer extensions according to an exemplary embodiment; and FIGS. 85, 86, and 87 are cross-sectional views of a semiconductor structure after forming backside contact structures according to an exemplary embodiment.

Figure 6:
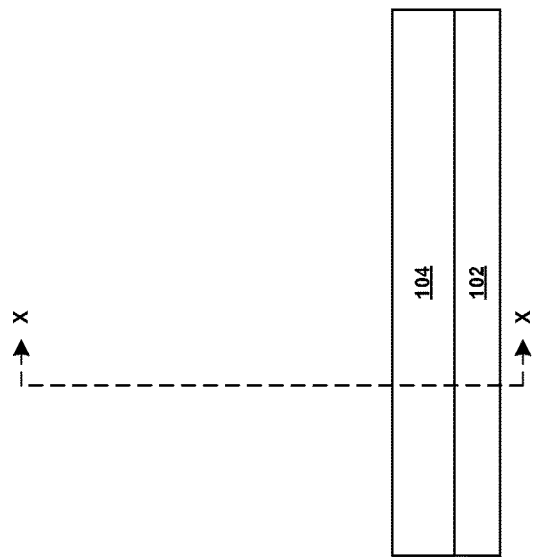
FIGS. 4, 5, and 6 are cross-sectional views of a semiconductor structure after forming a bottom sacrificial gate, bottom gate spacers, bottom inner spacers, gate hard masks, a bottom dielectric material, and openings according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

According to an embodiment the stacked transistor structures represented by the structure 100 includes stacked transistor structures (192, 194) each including a top device (196, 200) stacked directly above a bottom device (198, 202), and a placeholder dielectric (132) and a backside gate contact (188) within a dielectric capping layer 182 beneath the stacked transistor structures (192, 194), wherein the placeholder dielectric (132) is directly below a first bottom source drain region (138), and the backside gate contact (188) is directly below a second bottom source drain region (138).

According to an embodiment the stacked transistor structures represented by the structure 100 includes a first stacked transistor structure 192 includes a first top device 196 stacked directly above a first bottom device 198, a second stacked transistor structure 194 adjacent to the first stacked transistor 192, the second stacked transistor including a second top device 200 stacked directly above a second bottom device 202, and a placeholder dielectric (132) and a backside gate contact (188) within a dielectric capping layer 182 beneath both the first stacked transistor structure 192 and the second stacked transistor structure 194, where the placeholder dielectric (132) is directly below a first bottom source drain region (138) of the first transistor structure 192, and the backside gate contact (188) is directly below a second bottom source drain region of the second transistor structure 194.

According to an embodiment the stacked transistor structures represented by the structure 100 includes stacked transistor structures (192, 194) each including a top device (196, 200) stacked directly above a bottom device (198, 202), a placeholder dielectric (132) and a backside gate contact (188) within a dielectric capping layer 182 beneath the stacked transistor structures (192, 194), where the placeholder dielectric (132) is directly below a first bottom source drain region (138), and the backside gate contact (188) is directly below a second bottom source drain region (138), and a bottom gate cut insulator 166 extending through the dielectric capping layer 182, where the bottom gate cut insulator 166 directly contacts a gate dielectric layer 158.

According to an embodiment a lateral width of the placeholder dielectric (132) is substantially equal to a lateral width of the first bottom source drain region (138), as best illustrated in FIG. 85.

According to an embodiment a lateral width of the backside gate contact (188) is substantially equal to a lateral width of the second bottom source drain region (138), as best illustrated in FIG. 85.

According to an embodiment the stacked transistor structures represented by the structure 100 further include a functional bottom gate 180 associated with the bottom devices 198, 202 directly contacts the placeholder dielectric (132) and is physically separated from the backside gate contact (188).

According to an embodiment the stacked transistor structures represented by the structure 100 further include a functional bottom gate 180 associated with the bottom devices 198, 202, wherein a lowermost surface of the functional bottom gate 180 is entirely below the first bottom source drain region (138) and the second bottom source drain region (138), as best illustrated in FIG. 85.

According to an embodiment the stacked transistor structures represented by the structure 100 further include a functional bottom gate 180 associated with the bottom devices 198, 202, wherein a lowermost surface of the functional bottom gate 180 is entirely below uppermost surfaces of both the placeholder dielectric (132) and the backside gate contact (188), as best illustrated in FIG. 85.

According to an embodiment the stacked transistor structures represented by the structure 100 further include a bonding oxide layer 144 separating the bottom devices 198, 202 from the top devices 196, 200, wherein the bonding oxide layer 144 includes a discontinuous region between the first stacked transistor structure 192 and the second stacked transistor structure 194, wherein a gate dielectric layer 158 and a bottom gate cut insulator 166 both directly contact a vertical sidewall of the bonding oxide layer 144 in the discontinuous region.

Complementary field effect transistors, or stacked transistors, have known advantages over conventional transistor structures in terms of density, performance, power consumption, and integration. However, fabricating stacked transistor devices with varying threshold voltages continues to present unique challenges. More specifically, for example, backside replacement metal gate processing (with high-k being formed first in the frontside processing) can be used to produce stacked transistor structures with multiple threshold voltages all while avoiding damaging silicide during thermal annealing, such as during high-k reliability annealing. However, conventional backside replacement metal gate processing is not compatible with self-aligned backside contact processing.

The present invention generally relates to semiconductor structures, and more particularly to stacked transistor structures having self-aligned backside contact with backside replacement metal gate. More specifically, the stacked transistor structures and associated method disclosed herein enables a novel solution for providing stacked transistors having self-aligned backside contacts made using a backside replacement metal gate technique. Exemplary embodiments of the exemplary stacked transistors are described in detail below by referring to the accompanying drawings in FIGS. 1 to 87. Those skilled in the art will readily appreciate that the detailed description given herein with respect to these figures is for explanatory purposes as the invention extends beyond these limited embodiments.

Referring now to FIGS. 1, 2, and 3, a structure 100 is shown during an intermediate step of a method of fabricating a stacked transistor structure according to an embodiment of the invention. FIG. 1 depicts a cross-sectional view of the structure 100 taken along line X-X, FIG. 2 depicts a cross-sectional view of the structure 100 taken along line $Y_1$-$Y_1$, and FIG. 3 depicts a cross-sectional view of the structure 100 taken along line $Y_2$-$Y_2$.

The structure 100 illustrated in FIGS. 1-3 include nanosheet stacks 106 formed from an alternating series of silicon germanium (SiGe) sacrificial nanosheets 108, 110, 112 and silicon (Si) channel nanosheets 114, 116, 118. The nanosheet stacks 106 are formed on an oxide isolation layer 104, which is formed on a silicon substrate 102. This can be achieved by growing alternative Si/SiGe layers over an SiGeOI wafer with thin SiGe layer over BOX oxide layer over a Si substrate. Although only six alternating nanosheets 108, 110, 112, 114, 116, 118 are shown, one or more additional sacrificial nanosheets and/or channel nanosheets can optionally be epitaxially grown in an alternating fashion, and the properties of any additional nanosheets are the same as the corresponding nanosheets described herein.

In one or more embodiments, the alternating series of silicon germanium sacrificial nanosheets 108, 110, 112 and silicon channel nanosheets 114, 116, 118 are formed by epitaxially growing one layer and then the next until a desired number and a desired thicknesses of each layer is achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be undoped or can be doped during deposition (in-situ doped) by adding dopants, n-type dopants (e.g., phosphorus or arsenic) or p-type dopants (e.g., boron or gallium), depending on the type of transistor. For example, in at least one embodiment, each nanosheet stack 106 includes some combination of silicon channel nanosheets 114, 116, 118 undoped.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Known processing techniques have been applied to the alternating series of silicon germanium sacrificial nanosheets 108, 110, 112 and silicon channel nanosheets 114, 116, 118 shown in FIGS. 2 and 3 to form the nanosheet stack 106. For example, the known processing techniques can include the formation of hard masks (not shown) over the silicon channel nanosheet 118. The hard masks can be formed by first depositing the hard mask material (for example silicon nitride) onto the top silicon channel nanosheet 118 using, for example, chemical vapor deposition (CVD), plasma enhanced CVD (PECVD) or any suitable technique for dielectric deposition that does not induce a physical or chemical change to silicon channel nanosheet 118. According to an exemplary embodiment, the hard mask material is deposited onto the top silicon channel nanosheet 118 and then patterned into a plurality of the individual hard masks. Patterning the hard mask is commensurate with a desired footprint and location of the channel nanosheet stacks 106 as shown in FIGS. 2 and 3, which will subsequently be used to form the channel regions of bottom semiconductor devices disclosed herein. According to an exemplary embodiment, RIE is used to transfer the hard mask pattern into the alternating silicon and silicon germanium layers to form the nanosheet stacks 106.

Figure 5:
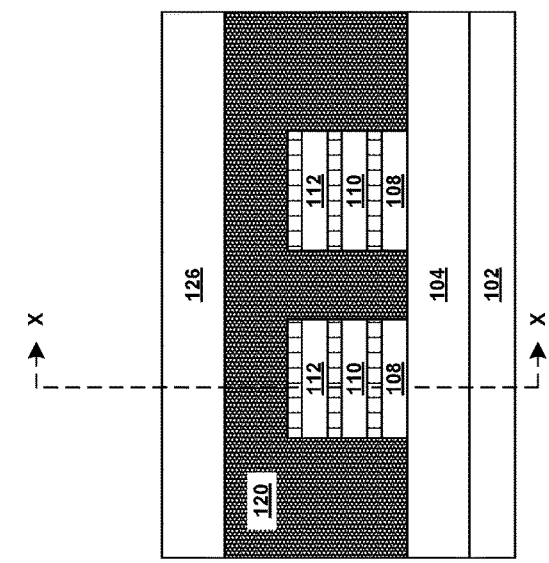
Figure 4:
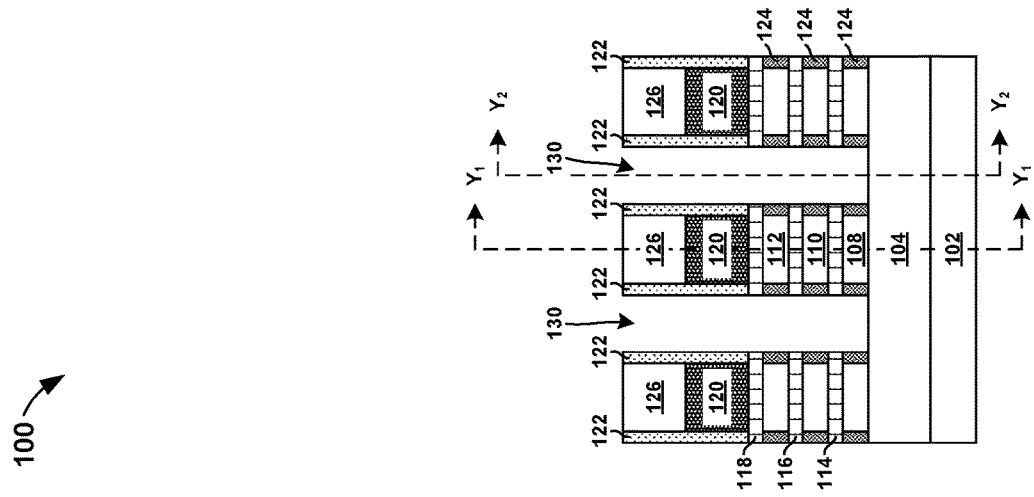

Referring now to FIGS. 4, 5, and 6, a structure 100 is shown after forming a bottom sacrificial gate 120, bottom gate spacers 122, bottom inner spacers 124, gate hard masks 126, and openings 130 according to an embodiment of the invention. FIG. 4 depicts a cross-sectional view of the structure 100 taken along line X-X, FIG. 5 depicts a cross-sectional view of the structure 100 taken along line $Y_1$-$Y_1$, and FIG. 6 depicts a cross-sectional view of the structure 100 taken along line $Y_2$-$Y_2$.

The bottom sacrificial gate 120 is formed over and around the nanosheet gate stacks 106 according to known techniques. As best shown in FIG. 5, the bottom sacrificial gate 120 is formed over the tops and sidewalls of the nanosheet stacks 106. In one or more embodiments, the bottom sacrificial gate 120 is formed from a thin a layer of silicon oxide (SiO2) and amorphous silicon (a-Si). More specifically, a relatively thin layer of silicon oxide is first conformally deposited over and around the nanosheet gate stacks 106 followed by a blanket layer of amorphous silicon.

The bottom gate spacers 122 are formed along the vertical sidewalls of the bottom sacrificial gate 120, as shown. The bottom gate spacers 122 can be formed using known techniques, which includes spacer material deposition followed by directional RIE of the deposited spacer material. A width of the bottom gate spacers 122 are chosen such that the bottom gate spacers 122 and the bottom sacrificial gate 120 define a width of a bottom device.

The bottom gate spacers 122 along with the gate hard masks 126 are in effect used as a mask, and portions of the silicon germanium sacrificial nanosheets 108, 110, 112, and the silicon channel nanosheets 114, 116, 118 not protected by the bottom sacrificial gate 120, the bottom gate spacers 122, and the gate hard masks 126 are recessed or removed using, for example, a silicon RIE process. Recessing or etching may continue until an uppermost surface of the oxide isolation layer 104 is exposed and the openings 130 are formed.

After, the silicon germanium sacrificial nanosheets 108, 110, 112 are laterally recessed to make room for the bottom inner spacers 124. In one or more embodiments, the silicon germanium sacrificial nanosheets 108, 110, 112 are laterally recessed using a hydrogen chloride (HCL) gas isotropic etch process, which etches silicon germanium without attacking silicon. Cavities (not shown) are formed by spaces that were occupied by the removed portions of silicon germanium sacrificial nanosheets 108, 110, 112.

The bottom inner spacers 124 are formed by first conformally depositing a spacer material over the structure 100 to fill the cavities created by laterally recessing the silicon germanium sacrificial nanosheets 108, 110, 112. As used herein, "conformal" it is meant that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

The conformal spacer material is then isotropically etched to remove all portions except those remaining in the cavities and forming the bottom inner spacers 124. In one or more embodiments, the bottom inner spacers 124 are made from a nitride containing material, for example silicon nitride (SiN). Although the bottom inner spacers 124 disclosed herein are often formed from a nitride containing material, they can be formed from any material for which supports selectivity during subsequent device fabrication operations. Selectivity, as used in the present description, refers to the tendency of a process operation to impact a particular material. One example of low selectivity is a relatively slow etch rate. One example of a higher or greater selectivity is a relatively faster etch rate. For the described embodiments, a material for the bottom inner spacers 124 can be selected based on a selectivity of subsequent device fabrication operations for the selected material being below a predetermined threshold.

The bottom inner spacers 124 are positioned such that subsequent etching processes used to remove the silicon germanium sacrificial nanosheets 108, 110, 112 during device fabrication do not also attack subsequently formed source drain regions.

Referring now to FIGS. 7, 8, and 9, a structure 100 is shown after selectively recessing the openings 130 into the oxide isolation layer 104 and the silicon substrate 102 according to an embodiment of the invention. FIG. 7 depicts a cross-sectional view of the structure 100 taken along line X-X, FIG. 8 depicts a cross-sectional view of the structure 100 taken along line $Y_1$-$Y_1$, and FIG. 9 depicts a cross-sectional view of the structure 100 taken along line $Y_2$-$Y_2$.

Portions of the oxide isolation layer 104 and the silicon substrate 102 and the are etched or removed to extend the depth of the openings 130 in preparation for backside process as discussed below. Specifically, known techniques such as, for example, reactive ion etching (RIE) may be used. Recessing or etching may continue until the openings 130 extend approximately half way through the silicon substrate 102. If the openings 130 are etched too deep, the structure 100 may be fragile and lack the derided structure rigidity for subsequent processing.

Referring now to FIGS. 10, 11, and 12, a structure 100 is shown after forming a first placeholder 132 in the openings 130 according to an embodiment of the invention. FIG. 10 depicts a cross-sectional view of the structure 100 taken along line X-X, FIG. 11 depicts a cross-sectional view of the structure 100 taken along line $Y_1$-$Y_1$, and FIG. 12 depicts a cross-sectional view of the structure 100 taken along line $Y_2$-$Y_2$.

The openings 130 are filled with a first sacrificial placeholder material according to known techniques. After, the first sacrificial placeholder material is recessed to create the first placeholder 132 according to known techniques. In an embodiment, the first sacrificial placeholder material is SiC, SiOC deposited using, for example, chemical vapor deposition (CVD) or plasma enhanced CVD (PECVD) and subsequently recessed using, for example, reactive ion etching (RIE). Other suitable deposition and recessing techniques may be used provided they do not induce a physical or chemical change to silicon channel nanosheets 118. It is critical the first placeholder 132 completely cover the oxide isolation layer 104 in order to prevent shorting between subsequently formed bottom source drain regions and functional bottom gats. (See FIGS. 76-78). Said differently, it is critical not to recess the first sacrificial placeholder material below the bottommost inner spacers 124, as illustrated in FIG. 10. Finally, the first placeholder 132 can also be referred to as a placeholder dielectric 132.

Referring now to FIGS. 13, 14, and 15, a structure 100 is shown after forming a mask 134 and removing portions of the first placeholder 132 according to an embodiment of the invention. FIG. 13 depicts a cross-sectional view of the structure 100 taken along line X-X, FIG. 14 depicts a cross-sectional view of the structure 100 taken along line $Y_1$-$Y_1$, and FIG. 15 depicts a cross-sectional view of the structure 100 taken along line $Y_2$-$Y_2$.

First, the mask 134 is deposited and subsequently patterned to expose certain portions of the structure 100 according to known techniques. Specifically, portions of the first placeholder 132 in regions where backside contacts will be subsequently formed are exposed, as illustrated in FIG. 13.

The mask 134 can be an organic planarization layer (OPL) or a layer of material that is capable of being planarized or etched by known techniques. In an embodiment, for example, the mask 134 can be an amorphous carbon layer able to withstand subsequent processing temperatures. The mask 134 can preferably have a thickness sufficient to cover existing structures. After deposition of the mask 134, a dry etching technique is applied to pattern the mask 134.

Next, portions of the first placeholder 132 in regions where backside contacts will be subsequently formed are removed according to known techniques. Specifically, exposed portions of the first placeholder 132 are removed using known etching techniques suitable to remove SiC, SiOC selective to the bottom inner spacers 124, the oxide isolation layer 104, which is formed on a silicon substrate 102.

Referring now to FIGS. 16, 17, and 18, a structure 100 is shown after forming a second placeholder 136 according to an embodiment of the invention. FIG. 16 depicts a cross-sectional view of the structure 100 taken along line X-X, FIG. 17 depicts a cross-sectional view of the structure 100 taken along line $Y_1$-$Y_1$, and FIG. 18 depicts a cross-sectional view of the structure 100 taken along line $Y_2$-$Y_2$.

The openings 130 remaining after removal of the portions of the first placeholder 132 are filled with a second sacrificial placeholder material according to known techniques. After, the second sacrificial placeholder material is recessed to create the second placeholder 136 according to known techniques. In an embodiment, the second sacrificial placeholder material is chosen to be different than the first sacrificial placeholder material of the first placeholder 132. For example, the second sacrificial placeholder material can include materials such as AlOx, TiOx, SiGe, or other suitable materials deposited using, for example, chemical vapor deposition (CVD) or plasma enhanced CVD (PECVD) and subsequently recessed using, for example, reactive ion etching (RIE). Other suitable deposition and recessing techniques may be used provided they do not induce a physical or chemical change to silicon channel nanosheets 118.

Figure 19:
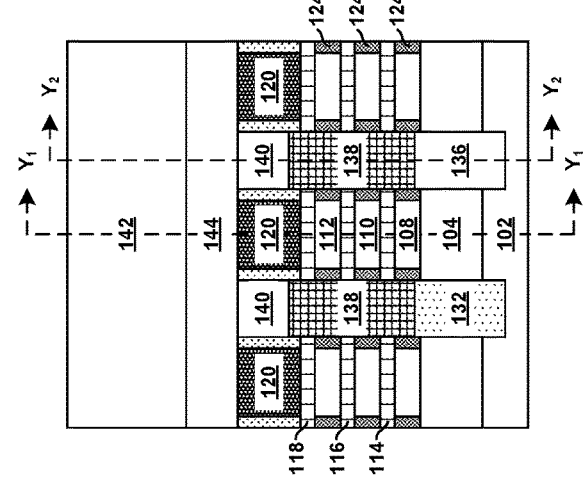
FIGS. 19, 20, and 21 are cross-sectional views of a semiconductor structure after forming bottom source drain regions, a bottom dielectric material, and bonding a top semiconductor channel material to the structure according to an exemplary embodiment.
Figure 20:
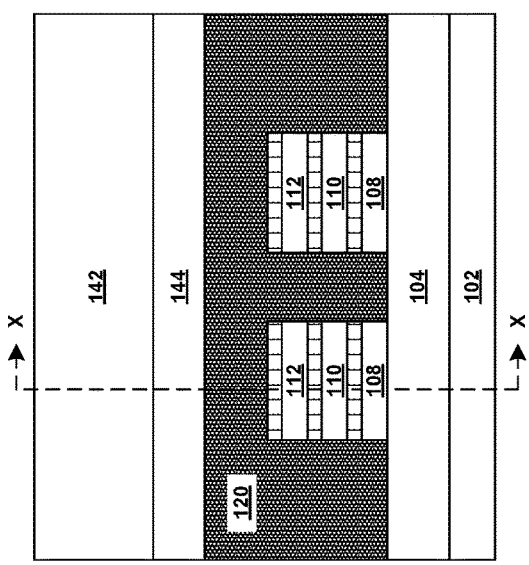
Figure 21:
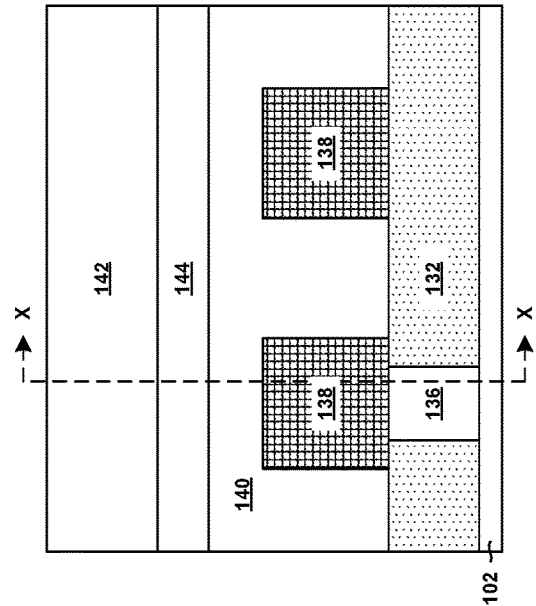

Referring now to FIGS. 19, 20, and 21, a structure 100 is shown after forming bottom source drain regions 138, a bottom dielectric material 140, and bonding a top semiconductor channel material to the structure 100 according to an embodiment of the invention. FIG. 19 depicts a cross-sectional view of the structure 100 taken along line X-X, FIG. 20 depicts a cross-sectional view of the structure 100 taken along line $Y_1$-$Y_1$, and FIG. 21 depicts a cross-sectional view of the structure 100 taken along line $Y_2$-$Y_2$.

First, the mask 134 is removed using known techniques, for example, by ashing. Next, the bottom source drain regions 138 are formed using an epitaxial layer growth process on the exposed ends of the silicon channel nanosheets 114, 116, 118. Typically, in-situ doping is used to doped the bottom source drain regions 138, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type devices are formed by implanting different types of dopants to selected regions of the device to form the necessary junction(s). N-type devices can be formed by implanting arsenic (As) or phosphorous (P), and p-type devices can be formed by implanting boron (B).

The bottom dielectric material 140 is formed by depositing an interlayer dielectric material over the structure 100 according to known techniques. The bottom dielectric material 140 is formed on the bottom source drain regions 138. After, the bottom dielectric material 140 can be polished using known techniques until a topmost surface of the bottom dielectric material 140 is flush, or substantially flush, with topmost surfaces of the bottom sacrificial gate 120 and the bottom gate spacers 122.

The bottom dielectric material 140 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as the bottom dielectric material 140. Using a self-planarizing dielectric material as the bottom dielectric material 140 can avoid the need to perform a subsequent planarizing step.

Next, according to embodiments of the present invention, an additional wafer 142 is bonded to the structure 100 using a conventional dielectric-to-dielectric bonding process, for example, oxide-to-oxide bonding. Specifically, a bonding oxide layer 144 can be blanket deposited over the existing structure, as shown and the additional wafer 142, for example a semiconductor substrate, is then attached to the existing structure 100 using known oxide-to-oxide bonding techniques. The bonding oxide layer 144 may generally include one or more bonding oxide layers according to know techniques.

For example, a first bonding oxide layer can be blanket deposited over the existing structure and the additional wafer 142 includes a second bonding oxide layer. In practice, the additional wafer 142, including the second bonding oxide layer, is flipped so as to permit face-to-face bonding between the first bonding oxide layer and the second bonding oxide layer. For example, an oxide-to-oxide bond is formed between the first bonding oxide layer and the second bonding oxide layer. The bonding process is performed by pressing the bonding layers together, for example face-to-face, at room temperature with a force initiating from a center contacting area. The contacting area will expand from the center outward across the layers. Thereafter, a thermal anneal at 280 degrees Celsius (° C.) for greater than about 12 hours, e.g., for about 24 hours, is required to enforce the bonding quality.

After bonding, the additional wafer 142 is thinned or recessed to a desired thickness. In at least one embodiment, the additional wafer 142 may further include one or more etch stop layers, for example silicon germanium, to facilitate thinning the substrate to the desired thickness.

Referring now to FIGS. 22, 23, and 24, a structure 100 is shown after forming fins 146 according to an embodiment of the invention. FIG. 22 depicts a cross-sectional view of the structure 100 taken along line X-X, FIG. 23 depicts a cross-sectional view of the structure 100 taken along line $Y_1$-$Y_1$, and FIG. 24 depicts a cross-sectional view of the structure 100 taken along line $Y_2$-$Y_2$.

After thinning, the fins 146 are formed from the remaining substrate layer of the additional wafer 142 according to known techniques. The fins 146 will form the channel regions of top devices in a stacked transistor configuration as described in greater detail below. Although the structure 100 is illustrated with a discrete number of fins 146, it may include any number of fins 146 in any number of configurations, as desired by the final design.

Referring now to FIGS. 25, 26, and 27, a structure 100 is shown after forming a top sacrificial gate 148, top gate spacers 150, top source drain regions 152, and a top dielectric material 154 according to an embodiment of the invention. FIG. 25 depicts a cross-sectional view of the structure 100 taken along line X-X, FIG. 26 depicts a cross-sectional view of the structure 100 taken along line $Y_1$-$Y_1$, and FIG. 27 depicts a cross-sectional view of the structure 100 taken along line $Y_2$-$Y_2$.

The top sacrificial gate 148 is formed over and around the fins 146 according to known techniques. As best shown in FIGS. 26 and 27, the top sacrificial gate 148 is formed over the tops and sidewalls of the fins 146. The top sacrificial gate 148 is formed in a similar manner and with similar materials as the bottom sacrificial gate 120 described above.

The top gate spacers 150 are formed in a similar manner and with similar materials as the bottom gate spacers 122 described above. The top gate spacers 150 are formed along the vertical sidewalls of the top sacrificial gate 148, as shown. A width of the top gate spacers 150 is chosen such that the top gate spacers 150 and the top sacrificial gate 148 define a width of a top device.

Also like above, the top gate spacers 150 are in effect used as a mask, and portions of the fins 146 that are not protected by the top sacrificial gate 148 or the top gate spacers 150 are recessed using a silicon RIE process and form an opening or trench (not shown). In at least one embodiment, recessing continues until the oxide bonding layer 144 is exposed.

The top source drain regions 152 are formed in a similar manner and with similar materials as the bottom source drain regions 138 described above. Like the bottom source drain regions 138 described above, the top source drain regions 152 are formed using an epitaxial layer growth process on the exposed ends of the fins 146 within the opening created by recessing portions of the fins 146.

The top dielectric material 154 is formed in a similar manner and with similar materials as the bottom dielectric material 140 described above. Like the bottom dielectric material 140 described above, the top dielectric material 154 is formed by depositing an interlayer dielectric material over the structure 100 according to known techniques. The top dielectric material 154 is formed on the top source drain regions 152. After, the top dielectric material 154 can be polished using known techniques until a topmost surface of the top dielectric material 154 is flush, or substantially flush, with topmost surfaces of the top sacrificial gate 148 and the top gate spacers 150.

Referring now to FIGS. 28, 29, and 30, a structure 100 is shown after forming an access opening 156 according to an embodiment of the invention. FIG. 28 depicts a cross-sectional view of the structure 100 taken along line X-X, FIG. 29 depicts a cross-sectional view of the structure 100 taken along line $Y_1$-$Y_1$, and FIG. 30 depicts a cross-sectional view of the structure 100 taken along line $Y_2$-$Y_2$.

The access opening 156 is formed through the top sacrificial gate 148 and the bonding oxide layer 144, and is specifically designed to expose the bottom sacrificial gate 120. The access opening 156 may be formed using masking and etching techniques known in the art. In practice, an anisotropic etching technique is commonly used to create the access opening 156. The access opening 156 is necessary for the subsequent removal of the bottom sacrificial gate 120 and later formation of any gate materials, as described in greater detail below.

According to embodiments of the present invention, the access opening 156 is created at or about the center of the structure 100 aligned with the bottom sacrificial gate 120 and the top sacrificial gate 148. The access opening 156 extends through the bonding oxide layer 144 and exposes the bottom sacrificial gate 120 to facilitate subsequent replacement gate processing.

It is critical the critical dimension, measured in the y-direction, of the access opening 156 is larger than the gate opening to facilitate and ensure successful gate dielectric and gate metal deposition. Said differently, It is critical the critical dimension of the access opening 156 is larger than the gate length or critical dimension of the top sacrificial gate 148 measured in the x-direction (see FIG. 28).

Referring now to FIGS. 31, 32, and 33, a structure 100 is shown after removing both the bottom sacrificial gate 120 and the top sacrificial gate 148 and removing the silicon germanium sacrificial nanosheets 108, 110, 112 according to an embodiment of the invention. FIG. 31 depicts a cross-sectional view of the structure 100 taken along line X-X, FIG. 32 depicts a cross-sectional view of the structure 100 taken along line $Y_1$-$Y_1$, and FIG. 33 depicts a cross-sectional view of the structure 100 taken along line $Y_2$-$Y_2$.

Next, the bottom sacrificial gate 120 and the top sacrificial gate 148 are selectively removed according to known techniques. Specifically, the bottom sacrificial gate 120 is etched or removed relative to the nanosheet stacks 106, and the top sacrificial gate 148 is removed or etched selective to the fins 146. For example, the amorphous silicon of both the bottom sacrificial gate 120 and the top sacrificial gate 148 are first removed selective to the relatively thin silicon oxide layer using known wet etching techniques, such as, for example, hot ammonia or TMAH. Next, the relatively thin silicon oxide layer is removed selective to the silicon germanium sacrificial nanosheets 108, 110, 112 and the fins 146 using alternative known wet etching techniques, such as, for example, a diluted hydrofluoric acid (DHF). The relatively thin silicon oxide layer protects the silicon germanium sacrificial nanosheets 108, 110, 112 and the fins 146 during selective removal of the amorphous silicon.

Finally, the silicon germanium sacrificial nanosheets 108, 110, 112 are removed according to known techniques. Specifically, the silicon germanium sacrificial nanosheets 108, 110, 112 are etched or removed selective to the silicon channel nanosheets 114, 116, 118. For example, the silicon germanium sacrificial nanosheets 108, 110, 112 are removed selective to the silicon channel nanosheets 114, 116, 118 according to known wet or dry etching techniques, such as, for example, vapor phased dry HCl etch. After etching, the silicon channel nanosheets 114, 116, 118 remain suspended and supported on opposite ends by the inner spacers 124 and the bottom source drain regions 138.

Referring now to FIGS. 34, 35, and 36, a structure 100 is shown after forming a gate dielectric layer 158 and a capping layer 160 according to an embodiment of the invention. FIG. 34 depicts a cross-sectional view of the structure 100 taken along line X-X, FIG. 35 depicts a cross-sectional view of the structure 100 taken along line $Y_1$-$Y_1$, and FIG. 36 depicts a cross-sectional view of the structure 100 taken along line $Y_2$-$Y_2$.

First, the gate dielectric layer 158 is conformally deposited directly on exposed surfaces within the openings and spaces left by removing the bottom sacrificial gate 120, the top sacrificial gate 148, and the silicon germanium sacrificial nanosheets 108, 110, 112. For example, the gate dielectric layer 158 is conformally deposited along exposed surfaces of the fins 146, the bonding oxide layer 144, the silicon channel nanosheets 114, 116, 118, and the oxide isolation layer 104, as best illustrated in FIG. 35. Additionally, the gate dielectric layer 158 is conformally deposited along exposed surfaces of the top gate spacers 150, the bottom gate spacers 122, and the inner spacers 124, as best illustrated in FIG. 34.

The gate dielectric layer 158 can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the gate dielectric layer 158 can have a thickness in ranging from approximately 1 nm to approximately 5 nm. Other thicknesses that are lesser than, or greater than, the aforementioned thickness range can also be used for the gate dielectric layer 158.

The gate dielectric layer 158 is composed of any known gate dielectric materials, for example, oxide, nitride, and/or oxynitride. In an example, the gate dielectric layer 158 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials. For example, a silicon dioxide layer and a high-k gate dielectric layer can be formed and used together as the gate dielectric layer 158. In at least one embodiment, the gate dielectric layer 158 is composed of hafnium oxide.

After, an optional protective oxide layer (not shown) is conformally deposited directly on the gate dielectric layer 158. The protective oxide layer can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the protective oxide layer can have a thickness in ranging from approximately 0.3 nm to approximately 2 nm. Other thicknesses that are lesser than, or greater than, the aforementioned thickness range can also be used for the protective oxide layer.

The protective oxide layer is composed of any known metal oxides which are capable of being subsequently removed selective to the gate dielectric layer 158. In at least one embodiment, the protective oxide layer is made of lanthanum oxide (LaOx). In at least another embodiment, the protective oxide layer is made of aluminum oxide (AlOx).

Finally, the capping layer 160 is blanket deposited over the structure 100 according to known techniques. More specifically, the capping layer 160 is deposited directly on top of the nitride layer and filling the openings and spaces left by removing the bottom sacrificial gate 120, the top sacrificial gate 148, and the silicon germanium sacrificial nanosheets 108, 110, 112. In most case, the capping layer 160 will also be deposited on uppermost surfaces of the structure 100 at large as shown.

The capping layer 160 can be composed of any known materials which are capable of being subsequently removed selective to the nitride layer. In at least one embodiment, the capping layer 160 is made of a relatively thin titanium nitride layer (TiN) followed by an amorphous silicon (a-Si) fill.

Referring now to FIGS. 37, 38, and 39, a structure 100 is shown after forming gate cut trenches 162 according to an embodiment of the invention. FIG. 37 depicts a cross-sectional view of the structure 100 taken along line X-X, FIG. 38 depicts a cross-sectional view of the structure 100 taken along line Y$_1$-Y$_1$, and FIG. 39 depicts a cross-sectional view of the structure 100 taken along line Y$_2$-Y$_2$.

A gate cut mask (not shown) is formed over the structure 100 and exposed portions of the capping layer 160, are removed to create the gat cut trenches 162. Specifically, exposed portions of the capping layer 160, the bonding oxide layer 144, the gate dielectric layer 158, the oxide isolation layer 104, and into the substrate 102 are etched or removed selective to the gate cut mask according to known techniques. For example, anisotropic etching techniques such as, for example, reactive ion etching can be used to for the gate cut trenches.

A critical feature of the present invention is at least one of the gate cut trenches 162 is positioned between adjacent nanosheet stacks 106 and passes though the access opening 156 created in the bonding oxide layer 144. Meanwhile, the other gate cut trenches 162 physically pass through the gate dielectric layer 158 and the bonding oxide layer 144. All of the gate cut trenches 162 pass through the oxide isolation layer 104 and into the substrate 102. The gate cut trenches 162 define gate regions of individual devices, both top devices and bottom devices.

Referring now to FIGS. 40, 41, and 42, a structure 100 is shown after forming placeholder plug masks 164 according to an embodiment of the invention. FIG. 41 depicts a cross-sectional view of the structure 100 taken along line X-X, FIG. 42 depicts a cross-sectional view of the structure 100 taken along line Y$_1$-Y$_1$, and FIG. 43 depicts a cross-sectional view of the structure 100 taken along line Y$_2$-Y$_2$.

The gate cut trenches 162 are filled with a placeholder mask material according to known techniques. After, the placeholder mask material is recessed to create the placeholder plug masks 164 according to known techniques. In an embodiment, the placeholder mask material is an organic planarization layer (OPL) or a layer of material that is capable of being planarized or easily etched by known techniques, for example, chemical vapor deposition (CVD) or plasma enhanced CVD (PECVD) and subsequently recessed using, for example, reactive ion etching (RIE).

It is critical the placeholder plug masks 164 completely cover portions of the structure 100 at or below the bonding oxide layer 144. Said differently, it is critical not to recess the placeholder mask material below the bonding oxide layer 144. For purposes of a process window, after recessing a topmost surface of the placeholder plug masks 164 should be above the bottommost surface of the bonding oxide layer 144, and below the topmost surface of the bonding oxide layer 144, as best illustrated in FIG. 41.

Figures 43, 44, 45:
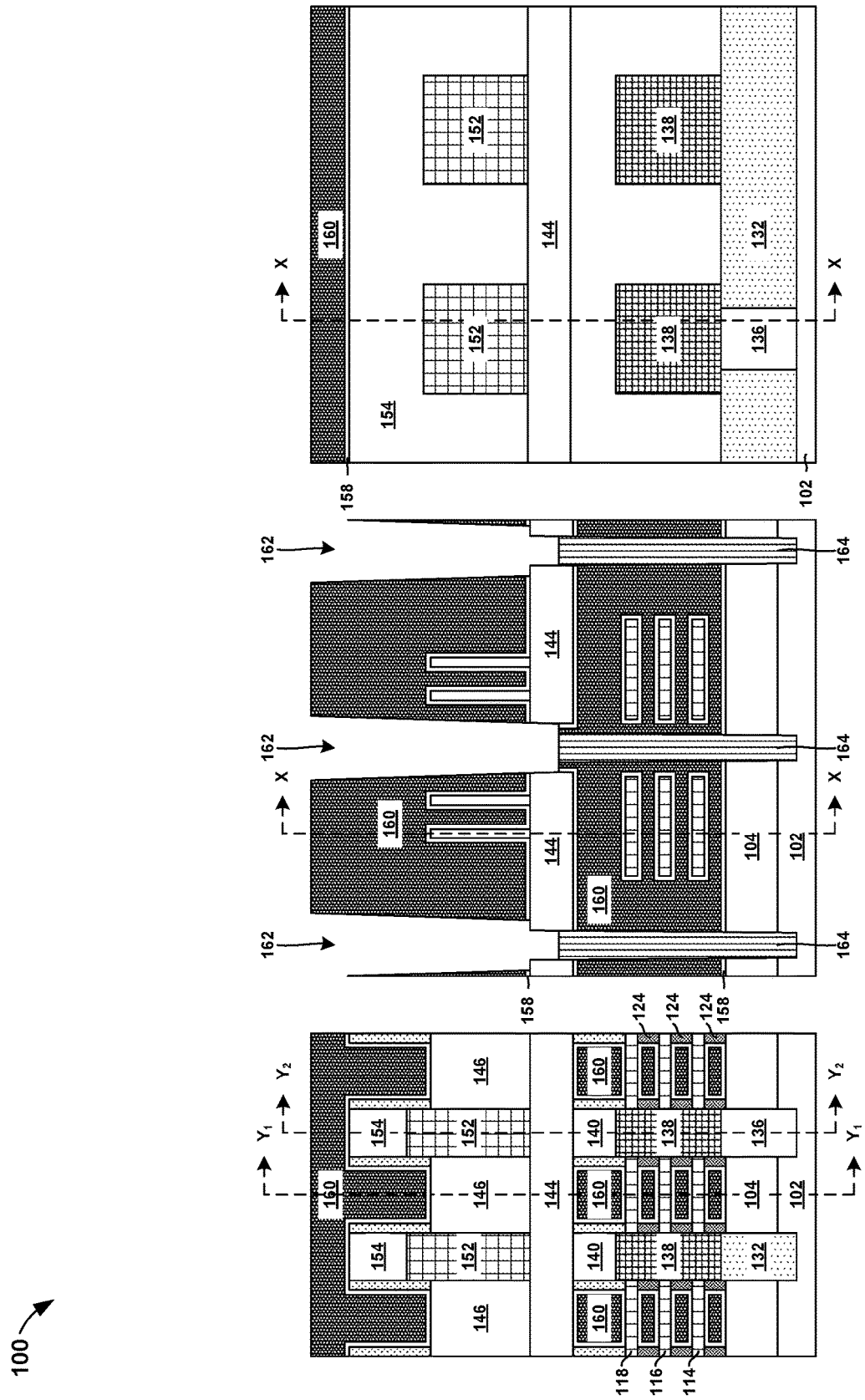
FIGS. 43, 44, and 45 are cross-sectional views of a semiconductor structure after trimming the capping layer according to an exemplary embodiment.

Referring now to FIGS. 43, 44, and 45, a structure 100 is shown after trimming the capping layer 160 according to an embodiment of the invention. FIG. 43 depicts a cross-sectional view of the structure 100 taken along line X-X, FIG. 44 depicts a cross-sectional view of the structure 100 taken along line Y$_1$-Y$_1$, and FIG. 45 depicts a cross-sectional view of the structure 100 taken along line Y$_2$-Y$_2$.

Portions of the gate cut trenches 162 exposed after recessing the placeholder mask material, are enlarged by etching or trimming the capping layer 160, according to known techniques. Specifically, an isotropic etching technique is applied to enlarge the lateral width or critical dimension of the exposed portions of the gate cut trenches 162 above the placeholder plug masks 164.

It is critical when trimming the capping layer 160 to fully expose the bonding oxide layer 144. Said differently, it is critical that exposed portions of the gate dielectric layer 158 are removed entirely from within the gate cut trenches 162, as illustrated. Doing so ensures electrical isolation between subsequently formed gate metals of bottom and top devices.

Referring now to FIGS. 46, 47, and 48, a structure 100 is shown after removing the placeholder plug masks 164 according to an embodiment of the invention. FIG. 46 depicts a cross-sectional view of the structure 100 taken along line X-X, FIG. 47 depicts a cross-sectional view of the structure 100 taken along line Y$_1$-Y$_1$, and FIG. 48 depicts a cross-sectional view of the structure 100 taken along line Y$_2$-Y$_2$.

The placeholder plug masks 164 are removed according to known techniques. For example, an O2 or N2/H2 ash process may be used to remove the placeholder plug masks 164.

Referring now to FIGS. 49, 50, and 51, a structure 100 is shown after forming bottom gate cut insulators 166 according to an embodiment of the invention. FIG. 49 depicts a cross-sectional view of the structure 100 taken along line X-X, FIG. 50 depicts a cross-sectional view of the structure 100 taken along line Y$_1$-Y$_1$, and FIG. 51 depicts a cross-sectional view of the structure 100 taken along line Y$_2$-Y$_2$.

The gate cut trenches 162 are filled with a dielectric insulating material according to known techniques. After, the dielectric insulating material is recessed to create the bottom gate cut insulators 166 according to known techniques. In an embodiment, the dielectric insulating material is SiC, SiOC or SiN, deposited using for example, chemical vapor deposition (CVD) or plasma enhanced CVD (PECVD) and subsequently recessed using, for example, reactive ion etching (RIE). It is critical the bottom gate cut insulators 166 completely cover the bonding oxide layer 144 to further ensure electrical isolation between subsequently formed gate metals of top devices and bottom devices, respectively. Further, the bottom gate cut insulators 166 define gate regions of individual bottom devices and will electrically insulate subsequently formed gate metals of adjacent bottom devices from one another, as is described in more detail below. It is noted the center-most bottom gate cut insulator (166) directly contacts the bonding oxide layer 144 where portions of the gate dielectric layer 158 were previously removed.

Referring now to FIGS. 52, 53, and 54, a structure 100 is shown after refilling the gate cut trenches 162 according to an embodiment of the invention. FIG. 52 depicts a cross-sectional view of the structure 100 taken along line X-X, FIG. 53 depicts a cross-sectional view of the structure 100 taken along line Y$_1$-Y$_1$, and FIG. 54 depicts a cross-sectional view of the structure 100 taken along line Y$_2$-Y$_2$.

The gate cut trenches 162 are filled with the same material as originally deposited when forming the capping layer 160. For example, in embodiments where the capping layer 160 is composed an amorphous silicon (a-Si) fill, amorphous silicon is used here to refill the gate cut trenches 162.

Referring now to FIGS. 55, 56, and 57, a structure 100 is shown after forming top gate cut insulators 168 according to an embodiment of the invention. FIG. 55 depicts a cross-sectional view of the structure 100 taken along line X-X, FIG. 56 depicts a cross-sectional view of the structure 100 taken along line Y$_1$-Y$_1$, and FIG. 57 depicts a cross-sectional view of the structure 100 taken along line Y$_2$-Y$_2$.

Another gate cut mask (not shown) is formed over the structure 100 and exposed portions of the capping layer 160 are removed and then filled with a dielectric insulating material to form the top gate cut insulators 168. The gate cut mask, and subsequently the top gate cut insulators 168, define gate regions of individual top devices. In an embodiment, the same dielectric insulating material is used for both the bottom gate cut insulators 166 and top gate cut insulators 168; however, the same dielectric insulating material is not required. For example, in an embodiment, both the both the bottom gate cut insulators 166 and top gate cut insulators 168 are made from SiC, SiOC or SiN deposited using, for example, chemical vapor deposition (CVD) or plasma enhanced CVD (PECVD). In at least one embodiment, some of the top gate cut insulators 168 are intentionally fabricated wider than the bottom gate cut insulators 166 while others are fabricated narrower, as illustrated in the figures. Doing so ensures proper separation and electrical isolation between final devices. In all cases, the top gate cut insulators 168 land on the bottom gate cut insulators 166, as illustrated.

Referring now to FIGS. 58, 59, and 60, a structure 100 is shown after removing the capping layer 160 according to an embodiment of the invention. FIG. 58 depicts a cross-sectional view of the structure 100 taken along line X-X, FIG. 59 depicts a cross-sectional view of the structure 100 taken along line $Y_1$-$Y_1$, and FIG. 60 depicts a cross-sectional view of the structure 100 taken along line $Y_2$-$Y_2$.

Portions of the capping layer 160 are selectively removed according to known techniques. Specifically, portions of the capping layer 160 are removed selective to the protective oxide layer (not shown). For example, portions of the capping layer 160 are removed selective to the protective oxide layer using known etching techniques, suitable to remove the amorphous silicon (a-Si) fill and the relatively thin titanium nitride layer selective to lanthanum oxide or aluminum oxide. In at least one embodiment, an isotropic wet etch, such as diluted HCL or TMAH, is used to selectively remove portions of the capping layer 160. In at least another embodiment, a dry etch, such as reactive ion etching, is used to selectively remove portions of the capping layer 160.

Next, exposed portions of the protective oxide layer are selectively removed according to known techniques. Specifically, portions of the oxide layer are removed selective to the gate dielectric layer 158. For example, portions of the oxide layer are removed selective to the gate dielectric layer 158 using known etching techniques suitable to remove lanthanum oxide or aluminum oxide selective to high-k dielectrics such as hafnium oxide. In at least one embodiment, an isotropic wet etch, such as diluted HCL or TMAH, is used to selectively remove exposed portions of the oxide layer. In at least another embodiment, a dry etch, such as reactive ion etching, is used to selectively remove exposed portions of the oxide layer.

At this stage of fabrication, portions of the capping layer 160 are only removed from top device regions above the bonding oxide layer 144, as illustrated. After removing portions of the capping layer 160 multiple top gate cavities remain, as illustrated.

Referring now to FIGS. 61, 62, and 63, a structure 100 is shown after forming functional top gates 170, a middle-of-line dielectric layer 172, contact structures 174, a back-end-of-line 176 (BEOL 176) and securing a carrier wafer 178 according to an embodiment of the invention. FIG. 61 depicts a cross-sectional view of the structure 100 taken along line X-X, FIG. 62 depicts a cross-sectional view of the structure 100 taken along line $Y_1$-$Y_1$, and FIG. 63 depicts a cross-sectional view of the structure 100 taken along line $Y_2$-$Y_2$.

The functional top gates 170 are formed within the top gate cavities and directly on exposed surfaces of the gate dielectric layer 158 according to known techniques. More specifically, the functional top gates 170 surround exposed the fins 146 as shown. As shown, the gate dielectric layer 158 physically separates the functional top gates 170 from the fins 146 as well as the bonding oxide layer 144. By "functional gate" it is meant a permanent gate structure used to control output current (i.e., flow of carriers in the channel) of a semiconducting device through electrical or magnetic fields.

In at least one embodiment, the functional top gates 170 are made of the same conductive material across the entire structure. In at least another embodiment, the functional top gates 170 are made from different conductive materials in each of the multiple top gate cavities. In doing so, the different conductive materials would be deposited successively according to the design parameters and desired operation characteristics.

The functional top gates 170 can include any known conductive gate material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or titanium carbon (TiC), titanium aluminum (TiAl), titanium aluminum carbon (TiAlC), or multilayered combinations thereof. In some embodiments, the functional top gates 170 can include an nFET gate metal. In other embodiments, the functional top gates 170 can include a pFET gate metal. When multiple top gate cavities are formed, as illustrated herein, embodiments of the present invention explicitly contemplate forming an nFET gate metal in at least one of the gate cavities and a pFET gate metal in at least another one of the gate cavities.

After forming the functional top gates 170, excess conductive gate material can be polished using known techniques until a topmost surface of the functional top gates 170 are flush, or substantially flush, with topmost surfaces of the top gate spacers 150. In doing so, portions of the gate dielectric layer 158 and portions of the top gate cut insulators 168 are also removed during polishing until a topmost surface of each are also flush, or substantially flush, with topmost surfaces of the top gate spacers 150.

Next, the middle-of-line dielectric layer 172 is blanket deposited across the structure 100 and contact trenches are subsequently formed in the middle-of-line dielectric layer 172, the top dielectric material 154, and the top gate cut insulators 168. The contact trenches are then filled with a conductive material to form the contact structure 174 according to known techniques. The contact structure 174 may include any suitable conductive material, such as, for example, copper, ruthenium, aluminum, tungsten, cobalt, or alloys thereof. In some embodiments, a metal silicide is formed at the bottom of the contact trenches prior to filling them with the conductive material. After, excess conductive material can be polished using known techniques until a topmost surface of the contact structures 174 are flush, or substantially flush, with topmost surfaces of the middle-of-line dielectric layer 172, as illustrated.

After forming the contact structures 174, the BEOL 176 is subsequently formed according to known techniques. Next, the carrier wafer 178 is attached, or removably secured, to the BEOL 176. In general, and not necessarily depicted, the carrier wafer 178 may be thicker than the other layers. Temporarily bonding the structure 100 to a thicker carrier provides improved handling and additional support for backside processing of thin wafers. After backside processing described below, the structure 100 may be de-bonded, or removed, from the carrier wafer 178 according to known techniques.

Referring now to FIGS. 64, 65, and 66, a structure 100 is shown after flipping the structure 100 and recessing the substrate 102 according to an embodiment of the invention. FIG. 64 depicts a cross-sectional view of the structure 100 taken along line X-X, FIG. 65 depicts a cross-sectional view of the structure 100 taken along line $Y_1$-$Y_1$, and FIG. 66 depicts a cross-sectional view of the structure 100 taken along line $Y_2$-$Y_2$.

First, the structure 100 is flipped 180 degrees to prepare for backside processing. Although in reality, the structure 100 will likely be physically flipped 180 degrees, the structures illustrated in the figures provided herein are not flipped or rotated, and the features and processes will continue to be described relative to the structure's orientation as illustrated in the figures. In general, backside processing includes fabrication or processing of the structure 100 opposite the active device and wiring layers. Next, the substrate 102 is recessed, and completely removed, to expose the carrier wafer 178 according to known techniques, as shown.

Referring now to FIGS. 67, 68, and 69, a structure 100 is shown after removing the oxide isolation layer 104 according to an embodiment of the invention. FIG. 67 depicts a cross-sectional view of the structure 100 taken along line X-X, FIG. 68 depicts a cross-sectional view of the structure 100 taken along line $Y_1$-$Y_1$, and FIG. 69 depicts a cross-sectional view of the structure 100 taken along line $Y_2$-$Y_2$.

Next, the oxide isolation layer 104 is recessed, and completely removed, to expose the gate dielectric layer 158 and the bottom gate spacers 122 according to known techniques, as shown.

Referring now to FIGS. 70, 71, and 72, a structure 100 is shown after removing the gate dielectric layer 158 according to an embodiment of the invention. FIG. 70 depicts a cross-sectional view of the structure 100 taken along line X-X, FIG. 71 depicts a cross-sectional view of the structure 100 taken along line $Y_1$-$Y_1$, and FIG. 72 depicts a cross-sectional view of the structure 100 taken along line $Y_2$-$Y_2$.

Next, the gate dielectric layer 158 is recessed to expose portions of the capping layer 160 in the bottom device regions according to known techniques, as shown. The gate dielectric layer 158 is recessed, or etched, selective to the first placeholder 132, the second placeholder 136, and the bottom gate cut insulators 166. Specifically, exposed portions of the gate dielectric layer 158 are removed using known etching techniques suitable to remove high-k dielectrics selective to the first placeholder 132, the second placeholder 136, and the bottom gate cut insulators 166.

Referring now to FIGS. 73, 74, and 75, a structure 100 is shown after removing remaining portions of the capping layer 160 according to an embodiment of the invention. FIG. 73 depicts a cross-sectional view of the structure 100 taken along line X-X, FIG. 74 depicts a cross-sectional view of the structure 100 taken along line $Y_1$-$Y_1$, and FIG. 75 depicts a cross-sectional view of the structure 100 taken along line $Y_2$-$Y_2$.

Remaining portions of the capping layer 160 are selectively removed according to known techniques as previously described above. At this stage of fabrication, the remaining portions of the capping layer 160 are only removed from bottom device regions below the bonding oxide layer 144, as illustrated. After removing the remaining portions of the capping layer 160 multiple bottom gate cavities remain, as illustrated.

Referring now to FIGS. 76, 77, and 78, a structure 100 is shown after forming functional bottom gates 180 and a self-aligned dielectric capping layer 182 (hereinafter "dielectric capping layer 182") according to an embodiment of the invention. FIG. 76 depicts a cross-sectional view of the structure 100 taken along line X-X, FIG. 77 depicts a cross-sectional view of the structure 100 taken along line $Y_1$-$Y_1$, and FIG. 78 depicts a cross-sectional view of the structure 100 taken along line $Y_2$-$Y_2$.

The functional bottom gates 180 are formed within the top gate cavities and directly on exposed surfaces of the gate dielectric layer 158 according to known techniques. More specifically, the functional bottom gates 180 surround exposed portions of the silicon channel nanosheets 114, 116, 118 as shown. As shown, the gate dielectric layer 158 physically separates the functional bottom gates 180 from the silicon channel nanosheets 114, 116, 118 as well as the bonding oxide layer 144.

In at least one embodiment, the functional bottom gates 180 are made of the same conductive material across the entire structure. In at least another embodiment, the functional bottom gates 180 are made from different conductive materials in each of the multiple bottom gate cavities. In doing so, the different conductive materials would be deposited successively according to the design parameters and desired operation characteristics. Further, in some embodiments, the functional bottom gates 180 may be made from the same or similar conductive materials as the functional top gates 170. In yet another embodiment, the functional bottom gates 180 may be made from different similar conductive materials as the functional top gates 170. For example, the functional bottom gates 180 and the functional top gates 170 may be made from at least four different conductive materials.

The functional bottom gates 180 can include any known conductive gate material including, for example, those described above with respect to the functional top gates 170. In some embodiments, the functional bottom gates 180 can include an nFET gate metal. In other embodiments, the functional bottom gates 180 can include a pFET gate metal. When multiple bottom gate cavities are formed, as illustrated herein, embodiments of the present invention explicitly contemplate forming an nFET gate metal in at least one of the gate cavities and a pFET gate metal in at least another one of the gate cavities.

In practice, the conductive gate material of the functional bottom gates 180 would be deposited in the cavities, polished, and then subsequently recessed according to known techniques. Ideally, the conductive gate material of the functional bottom gates 180 could be recessed flush with the bottom inner spacers 124; however, doing so is very challenging. If the conductive gate material of the functional bottom gates 180 is over recessed, the thickness of the lowermost functional bottom gate (180) for the lowermost bottom channel could become too thin and cause unwanted shifts in threshold voltage. Therefore, to avoid over recessing the conductive gate material of the functional bottom gates 180, recessing is intentionally stopped so the functional bottom gates 180 completely cover the gate dielectric layer 158 and the bottom inner spacers 124, as illustrated.

Next, the dielectric capping layer 182 is formed according to known techniques. More specifically, the dielectric capping layer 182 is deposited directly on top of the functional bottom gates 180 and fills the openings and spaces left by recessing the conductive gate material of the functional bottom gates 180. In most cases, the dielectric capping layer 182 will also be blanket deposited across surfaces of the structure 100 at large but subsequently removed or polished by known techniques. More specifically, after polishing a bottommost surface of the dielectric capping layer 182 is flush, or substantially flush, with bottommost surfaces of the first placeholder 132 and the second placeholder 136, as illustrated. The dielectric capping layer 182 can be composed of any known dielectric materials which are capable of electrically isolating the functional bottom gates 180, such as SiN.

Referring now to FIGS. 79, 80, and 81, a structure 100 is shown after removing the second placeholder 136 to create backside trenches 184 according to an embodiment of the invention. FIG. 79 depicts a cross-sectional view of the structure 100 taken along line X-X, FIG. 80 depicts a cross-sectional view of the structure 100 taken along line $Y_1$-$Y_1$, and FIG. 81 depicts a cross-sectional view of the structure 100 taken along line $Y_2$-$Y_2$.

The second placeholder 136 is selectively removed according to known techniques. Specifically, the second placeholder 136 is etched or removed selective to the dielectric capping layer 182, the functional bottom gates 180, and the bottom source drain regions 138. For example, anisotropic etching techniques such as, for example, reactive ion etching can be used to remove the second placeholder 136. The backside trenches 184 are created by removing the second placeholder 136. Portions of the dielectric capping layer 182, the functional bottom gates 180, and the bottom source drain regions 138 are exposed by the backside trenches 184. In some cases, depending on previous fabrication, portions of the bottom gate spacers 122 may also be exposed by the backside trenches 184.

Referring now to FIGS. 82, 83, and 84, a structure 100 is shown after recessing a portion of the functional bottom gates 180 and forming bottom inner spacer extensions 186 according to an embodiment of the invention. FIG. 82 depicts a cross-sectional view of the structure 100 taken along line X-X, FIG. 83 depicts a cross-sectional view of the structure 100 taken along line $Y_1$-$Y_1$, and FIG. 84 depicts a cross-sectional view of the structure 100 taken along line $Y_2$-$Y_2$.

The portions of the functional bottom gates 180 exposed in the backside trenches 184 are laterally recessed to make room for the bottom inner spacer extensions 186. In one or more embodiments, the portions of the functional bottom gates 180 are laterally recessed using an isotropic etching technique, which etches silicon germanium without attacking silicon. Cavities (not shown) are formed by spaces that were occupied by the removed portions of the portions of the functional bottom gates 180.

The bottom inner spacer extensions 186 are formed by first conformally depositing a spacer material over the structure 100 to fill the cavities created by laterally recessing the portions of the functional bottom gates 180. The conformal spacer material is then isotropically etched to remove all portions except those remaining in the cavities and forming the bottom inner spacer extensions 186. In an embodiment, the bottom inner spacer extensions 186 are made from the same nitride containing material as the bottom inner spacers 124. For example, in an embodiment, both the bottom inner spacer extensions 186 and the bottom inner spacers 124 are made from silicon nitride (SiN). In another embodiment, the bottom inner spacer extensions 186 are made from the same dielectric material as the dielectric capping layer 182. For example, in an embodiment, both the bottom inner spacer extensions 186 and the dielectric capping layer 182 are made from silicon nitride (SiN).

The bottom inner spacer extensions 186 are uniquely positioned to separate and electrically isolate the functional bottom gates 180 from subsequently formed backside contacts. In all cases, the bottom inner spacer extensions 186 should be formed from a dielectric material which will provide adequate isolation between the functional bottom gates 180 from subsequently formed backside contacts.

Referring now to FIGS. 85, 86, and 87, a structure 100 is shown after forming self-aligned backside contact structures 188 (hereinafter "backside contact structures 188") and a backside interconnect level 190 according to an embodiment of the invention. FIG. 85 depicts a cross-sectional view of the structure 100 taken along line X-X, FIG. 86 depicts a cross-sectional view of the structure 100 taken along line $Y_1$-$Y_1$, and FIG. 87 depicts a cross-sectional view of the structure 100 taken along line $Y_2$-$Y_2$.

The backside trenches 184 are then filled with a conductive material to form the backside contact structures 188 according to known techniques. The backside contact structures 188 may include any suitable conductive material, such as, for example, copper, ruthenium, aluminum, tungsten, cobalt, or alloys thereof. In some embodiments, a metal silicide is formed at the bottom of the backside trenches 184 prior to filling them with the conductive material. After, excess conductive material can be polished using known techniques until bottommost surfaces of the backside contact structures 188 are flush, or substantially flush, with topmost surfaces of the dielectric capping layer 182, as illustrated. After forming the contact structures 174, the backside interconnect level 190 is subsequently formed according to known techniques. It is noted, the backside contact structures 188 may include, for example, backside gate contacts as illustrated in FIG. 85, and backside source drain contacts as illustrated in FIG. 87.

As illustrated in FIGS. 85, 86, and 87, the stacked transistor structures represented by the structure 100 have some distinctive notable features. For purposes of this description the structure 100 illustrated in the figures and described herein includes multiple stacked transistor structures positioned adjacent, or next, to one another, and manufactured in a single replacement gate process flow. Further, each of the stacked transistor structures includes a top device and a bottom device. More specifically, both devices have a nanosheet or gate-all-around structure, and top devices have a fin structure.

In sum, the structure 100 and associated process flow enable manufacturing of stacked devices having self-aligned backside contact with backside replacement metal gate. Even more specifically, the functional gates of the structure 100 are each fabricated using known replacement gate techniques but in separate frontside and backside processing stages. This is accomplished by using a variety of placeholder materials and selective etching sequences as described in detailed above.

With continued reference to FIGS. 85, 86, and 87, according to an embodiment the stacked transistor structures represented by the structure 100 includes stacked transistor structures (192, 194) each including a top device (196, 200) stacked directly above a bottom device (198, 202), and a placeholder dielectric (132) and a backside gate contact (188) within a dielectric capping layer 182 beneath the stacked transistor structures (192, 194), wherein the placeholder dielectric (132) is directly below a first bottom source drain region (138), and the backside gate contact (188) is directly below a second bottom source drain region (138).

According to an embodiment the stacked transistor structures represented by the structure 100 includes a first stacked transistor structure 192 includes a first top device 196 stacked directly above a first bottom device 198, a second stacked transistor structure 194 adjacent to the first stacked transistor 192, the second stacked transistor including a second top device 200 stacked directly above a second bottom device 202, and a placeholder dielectric (132) and a backside gate contact (188) within a dielectric capping layer 182 beneath both the first stacked transistor structure 192 and the second stacked transistor structure 194, where the placeholder dielectric (132) is directly below a first bottom source drain region (138) of the first transistor structure 192, and the backside gate contact (188) is directly below a second bottom source drain region of the second transistor structure 194.

According to an embodiment the stacked transistor structures represented by the structure 100 includes stacked transistor structures (192, 194) each including a top device (196, 200) stacked directly above a bottom device (198, 202), a placeholder dielectric (132) and a backside gate contact (188) within a dielectric capping layer 182 beneath the stacked transistor structures (192, 194), where the placeholder dielectric (132) is directly below a first bottom source drain region (138), and the backside gate contact (188) is directly below a second bottom source drain region (138), and a bottom gate cut insulator 166 extending through the dielectric capping layer 182, where the bottom gate cut insulator 166 directly contacts a gate dielectric layer 158.

According to an embodiment a lateral width of the placeholder dielectric (132) is substantially equal to a lateral width of the first bottom source drain region (138), as best illustrated in FIG. 85.

According to an embodiment a lateral width of the backside gate contact (188) is substantially equal to a lateral width of the second bottom source drain region (138), as best illustrated in FIG. 85.

According to an embodiment the stacked transistor structures represented by the structure 100 further include a functional bottom gate 180 associated with the bottom devices 198, 202 directly contacts the placeholder dielectric (132) and is physically separated from the backside gate contact (188).

According to an embodiment the stacked transistor structures represented by the structure 100 further include a functional bottom gate 180 associated with the bottom devices 198, 202, wherein a lowermost surface of the functional bottom gate 180 is entirely below the first bottom source drain region (138) and the second bottom source drain region (138), as best illustrated in FIG. 85.

According to an embodiment the stacked transistor structures represented by the structure 100 further include a functional bottom gate 180 associated with the bottom devices 198, 202, wherein a lowermost surface of the functional bottom gate 180 is entirely below uppermost surfaces of both the placeholder dielectric (132) and the backside gate contact (188), as best illustrated in FIG. 85.

According to an embodiment the stacked transistor structures represented by the structure 100 further include a bonding oxide layer 144 separating the bottom devices 198, 202 from the top devices 196, 200, wherein the bonding oxide layer 144 includes a discontinuous region between the first stacked transistor structure 192 and the second stacked transistor structure 194, wherein a gate dielectric layer 158 and a bottom gate cut insulator 166 both directly contact a vertical sidewall of the bonding oxide layer 144 in the discontinuous region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   stacked transistor structures each comprising a top device stacked directly above a bottom device; and
   a placeholder dielectric and a backside gate contact within a dielectric capping layer beneath the stacked transistor structures, wherein the placeholder dielectric is directly below a first bottom source drain region, and the backside gate contact is directly below a second bottom source drain region.

2. The semiconductor structure according to claim 1, wherein a lateral width of the placeholder dielectric is substantially equal to a lateral width of the first bottom source drain region.

3. The semiconductor structure according to claim 1, wherein a lateral width of the backside gate contact is substantially equal to a lateral width of the second bottom source drain region.

4. The semiconductor structure according to claim 1, further comprising:
   a functional bottom gate associated with the bottom devices directly contacts the placeholder dielectric and is physically separated from the backside gate contact.

5. The semiconductor structure according to claim 1, further comprising:
   a functional bottom gate associated with the bottom devices, wherein a lowermost surface of the functional bottom gate is entirely below the first bottom source drain region and the second bottom source drain region.

6. The semiconductor structure according to claim 1, further comprising:
   a functional bottom gate associated with the bottom devices, wherein a lowermost surface of the functional bottom gate is entirely below uppermost surfaces of both the placeholder dielectric and the backside gate contact.

7. The semiconductor structure according to claim 1, further comprising:
   a bonding oxide layer separating the bottom devices from the top devices, wherein the bonding oxide layer includes a discontinuous region between the first stacked transistor structure and the second stacked transistor structure, wherein a gate dielectric layer and a bottom gate cut insulator both directly contact a vertical sidewall of the bonding oxide layer in the discontinuous region.

8. A semiconductor structure comprising:
   a first stacked transistor structure comprising a first top device stacked directly above a first bottom device;
   a second stacked transistor structure adjacent to the first stacked transistor structure, the second stacked transistor structure comprising a second top device stacked directly above a second bottom device; and
   a placeholder dielectric and a backside gate contact within a dielectric capping layer beneath both the first stacked transistor structure and the second stacked transistor structure, wherein the placeholder dielectric is directly below a first bottom source drain region of the first stacked transistor structure, and the backside gate contact is directly below a bottom second source drain region of the second stacked transistor structure.

9. The semiconductor structure according to claim 8, wherein a lateral width of the placeholder dielectric is substantially equal to a lateral width of the first bottom source drain region.

10. The semiconductor structure according to claim 8, wherein a lateral width of the backside gate contact is substantially equal to a lateral width of the second bottom source drain region.

11. The semiconductor structure according to claim 8, further comprising:
    a functional bottom gate associated with both the first bottom device and the second bottom device, wherein the functional bottom gate directly contacts the placeholder dielectric and is physically separated from the backside gate contact.

12. The semiconductor structure according to claim 8, further comprising:
    a functional bottom gate associated with both the first bottom device and the second bottom device, wherein a lowermost surface of the functional bottom gate is entirely below the first bottom source drain region and the second bottom source drain region.

13. The semiconductor structure according to claim 8, further comprising:
    a functional bottom gate associated with both the first bottom device and the second bottom device, wherein a lowermost surface of the functional bottom gate is entirely below uppermost surfaces of both the placeholder dielectric and the backside gate contact.

14. The semiconductor structure according to claim 8, further comprising:
    a bonding oxide layer separating the first and second bottom devices from the first and second top devices, wherein the bonding oxide layer includes a discontinuous region between the first stacked transistor structure and the second stacked transistor structure, wherein a gate dielectric layer and a bottom gate cut insulator both directly contact a vertical sidewall of the bonding oxide layer in the discontinuous region.

15. A semiconductor structure comprising:
    stacked transistor structures each comprising a top device stacked directly above a bottom device;
    a placeholder dielectric and a backside gate contact within a dielectric capping layer beneath the stacked transistor structures, wherein the placeholder dielectric is directly below a first bottom source drain region, and the backside gate contact is directly below a second bottom source drain region; and
    a bottom gate cut insulator extending through the dielectric capping layer, wherein the bottom gate cut insulator directly contacts a gate dielectric layer.

16. The semiconductor structure according to claim 15, wherein a lateral width of the placeholder dielectric is substantially equal to a lateral width of the first bottom source drain region.

17. The semiconductor structure according to claim 15, wherein a lateral width of the backside gate contact is substantially equal to a lateral width of the second bottom source drain region.

18. The semiconductor structure according to claim 15, further comprising:
    a functional bottom gate associated with the bottom devices directly contacts the placeholder dielectric and is physically separated from the backside gate contact.

19. The semiconductor structure according to claim 15, further comprising:
    a functional bottom gate associated with the bottom devices, wherein a lowermost surface of the functional bottom gate is entirely below the first bottom source drain region and the second bottom source drain region.

20. The semiconductor structure according to claim 15, further comprising:
    a functional bottom gate associated with the bottom devices, wherein a lowermost surface of the functional bottom gate is entirely below uppermost surfaces of both the placeholder dielectric and the backside gate contact.

21. The semiconductor structure according to claim 15, further comprising:
    a bonding oxide layer separating the first and second bottom devices from the first and second top devices, wherein the bonding oxide layer includes a discontinuous region between two of the stacked transistor structures, wherein the gate dielectric layer and the bottom gate cut insulator both directly contact a vertical sidewall of the bonding oxide layer in the discontinuous region.

* * * * *